US012696472B2

(12) United States Patent
Renaud et al.

(10) Patent No.: US 12,696,472 B2
(45) Date of Patent: Jul. 28, 2026

(54) SEMICONDUCTOR DEVICE WITH SELF-ALIGNED GATE AND FIELD PLATE AND METHOD OF FABRICATION THEREFOR

(71) Applicant: NXP USA, Inc., Austin, TX (US)

(72) Inventors: Philippe Renaud, Chandler, AZ (US); Congyong Zhu, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 391 days.

(21) Appl. No.: 18/451,767

(22) Filed: Aug. 17, 2023

(65) Prior Publication Data

US 2025/0063753 A1      Feb. 20, 2025

(51) Int. Cl.
  *H10D 30/47*      (2025.01)
  *H10D 64/00*      (2025.01)
  *H10D 64/01*      (2025.01)
  *H10D 64/27*      (2025.01)

(52) U.S. Cl.
  CPC .......... *H10D 30/475* (2025.01); *H10D 64/01* (2025.01); *H10D 64/111* (2025.01); *H10D 64/518* (2025.01)

(58) Field of Classification Search
  CPC .... H10D 30/475; H10D 64/01; H10D 64/111; H10D 64/518; H10D 30/015; H10D 64/018; H10D 62/149; H10D 62/8503
  See application file for complete search history.

(56) References Cited

U.S. PATENT DOCUMENTS

| | | | |
|---|---|---|---|
| 7,696,535 B2 | 4/2010 | Yang et al. | |
| 7,812,369 B2 | 10/2010 | Chini et al. | |
| 8,120,064 B2 | 2/2012 | Parikh et al. | |
| 8,946,779 B2 | 2/2015 | Green et al. | |
| 9,324,853 B2 | 4/2016 | Basu et al. | |
| 9,419,122 B1 | 8/2016 | Corrion et al. | |
| 9,847,411 B2 | 12/2017 | Sriram et al. | |
| 2014/0061659 A1 | 3/2014 | Teplik et al. | |
| 2017/0104097 A1* | 4/2017 | Park ..................... | H10D 64/117 |
| 2020/0227544 A1* | 7/2020 | Then ..................... | H10D 30/475 |
| 2021/0249534 A1* | 8/2021 | Neumann ........... | H10D 30/668 |
| 2022/0376085 A1* | 11/2022 | Bothe ................. | H10D 30/015 |
| 2023/0197797 A1 | 6/2023 | Zhu et al. | |
| 2023/0197839 A1 | 6/2023 | Zhu et al. | |
| 2023/0361183 A1* | 11/2023 | Hill ...................... | H10D 30/475 |

* cited by examiner

*Primary Examiner* — Yasser A Abdelaziez
(74) *Attorney, Agent, or Firm* — Sherry W. Gourlay

(57)      ABSTRACT

An embodiment of a semiconductor device includes a semiconductor substrate and one or more lower dielectric layers on the surface of the substrate. Source, drain, gate, and field plate openings, which are formed in a self-aligned manner, extend through the lower dielectric layer(s) to the substrate. A conformal dielectric layer is disposed over the lower dielectric layer(s) and into the gate and field plate openings. The conformal dielectric layer includes first portions on sidewalls of the gate opening, second portions on sidewalls of the field plate opening, and a third portion on the substrate at a bottom extent of the field plate opening. Gate spacers are formed on the first portions of the conformal dielectric layer. A gate electrode in the gate opening contacts the gate spacers and the semiconductor substrate. A field plate in the field plate opening contacts the second and third portions of the conformal dielectric layer.

20 Claims, 11 Drawing Sheets

SEMICONDUCTOR DEVICE WITH SELF-ALIGNED GATE AND FIELD PLATE AND METHOD OF FABRICATION THEREFOR

TECHNICAL FIELD

Embodiments of the subject matter described herein relate generally to semiconductor devices, and methods for fabricating such devices.

BACKGROUND

Semiconductor devices find application in a wide variety of electronic components and systems. For example, high power, high frequency transistors find application in radio frequency (RF) systems and power electronics systems. Gallium nitride (GaN) device technology is particularly well suited for these RF power and power electronics applications due to its superior electronic and thermal characteristics. In particular, the high electron velocity and high breakdown field strength of GaN make devices fabricated from this material ideal for RF power amplifiers and high-power switching applications.

GaN heterojunction field effect transistors (HFETs) include ohmic source and drain electrodes at opposite ends of a channel, with a gate electrode positioned above the channel between the source and drain electrodes. In addition, some GaN HFETs include a source connected field plate to enhance the performance and reliability of the transistors.

Characteristics of a GaN HFET that affect performance include gate resistance and gate-to-drain capacitance. Generally, it is desirable for the gate resistance and the gate-to-drain capacitance to be as low as possible for any given GaN HFET design, in order to achieve relatively high gain and good linearity.

One way to lower gate-to-drain capacitance is to reduce the space (distance) between the field plate and the GaN surface by reducing the dielectric layer separating the gate and the field plate. However, using conventional manufacturing methods, there is a limit to how small such spacing can be without having electrical shorts between the gate metal and the field plate. Accordingly, there is a need for semiconductor devices (e.g., GaN HFETs) with smaller gate-to-field plate spacing and methods of their fabrication.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
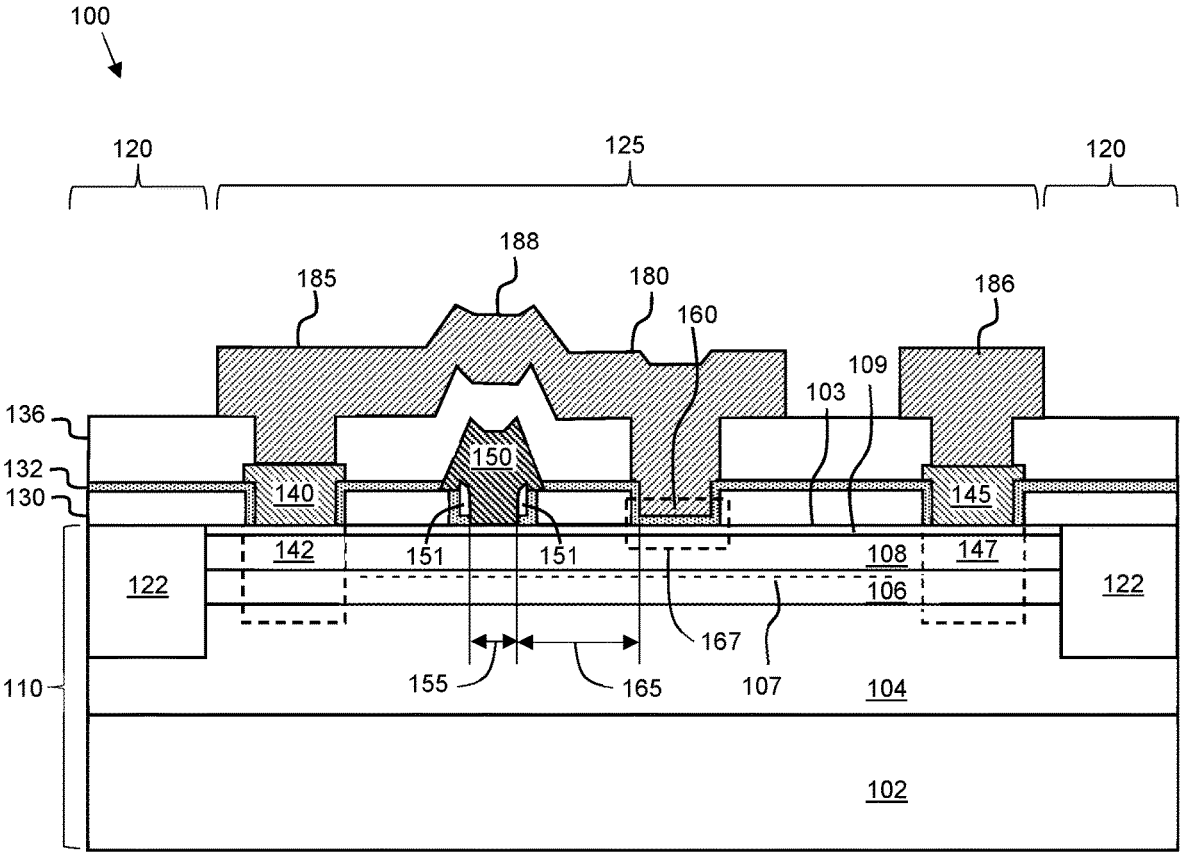
FIG. 1 is a cross-sectional, side view of an exemplary transistor, in accordance with an embodiment.

Embodiments of the inventive subject matter described herein include semiconductor devices and methods of their fabrication. More specifically, embodiments of semiconductor devices (e.g., transistor devices) are described herein which include a semiconductor substrate with an upper surface and a channel, and one or more lower dielectric layers disposed on the upper surface of the semiconductor substrate. Simultaneously-formed source, drain, gate, and field plate openings extend through the lower dielectric layer(s) to the semiconductor substrate. A single patterned photoresist mask is used to form the source, drain, gate, and field plate openings, according to one or more embodiments. A conformal dielectric layer is disposed over the lower dielectric layer(s) and into at least the gate opening and the field plate opening. The conformal dielectric layer includes first portions formed on sidewalls of the gate opening, second portions formed on sidewalls of the field plate opening, and a third portion formed on the semiconductor substrate at a bottom extent of the field plate opening. Gate spacers are disposed on the first portions of the conformal dielectric layer. A gate electrode is disposed in the gate opening in contact with the gate spacers and the semiconductor substrate. A field plate is disposed in the field plate opening in contact with the second and third portions of the conformal dielectric layer.

The various embodiments of the below-described semiconductor devices (e.g., device 100, FIG. 1) and methods of fabrication therefore may have several advantages over conventional devices and fabrication methods. For example, as will be described in detail below, one photolithography process (e.g., fabrication stage 400, FIG. 4) is used to define the source, drain, gate, and field plate openings through the passivation layer (e.g., openings 440, 445, 450, 460 through layer 130, FIG. 4). Accordingly, the source contact, drain contact, gate, and field plate (e.g., elements 140, 145, 150, 160, FIG. 1) all may be formed in a self-aligned manner. Essentially, the single photolithography process eliminates distance variations that otherwise may occur using conventional methods due to photo misalignments. This also may enable a very small gate-to-field plate spacing (e.g., dimension 165, FIG. 1) than is possible using conventional methods.

Figure 5:
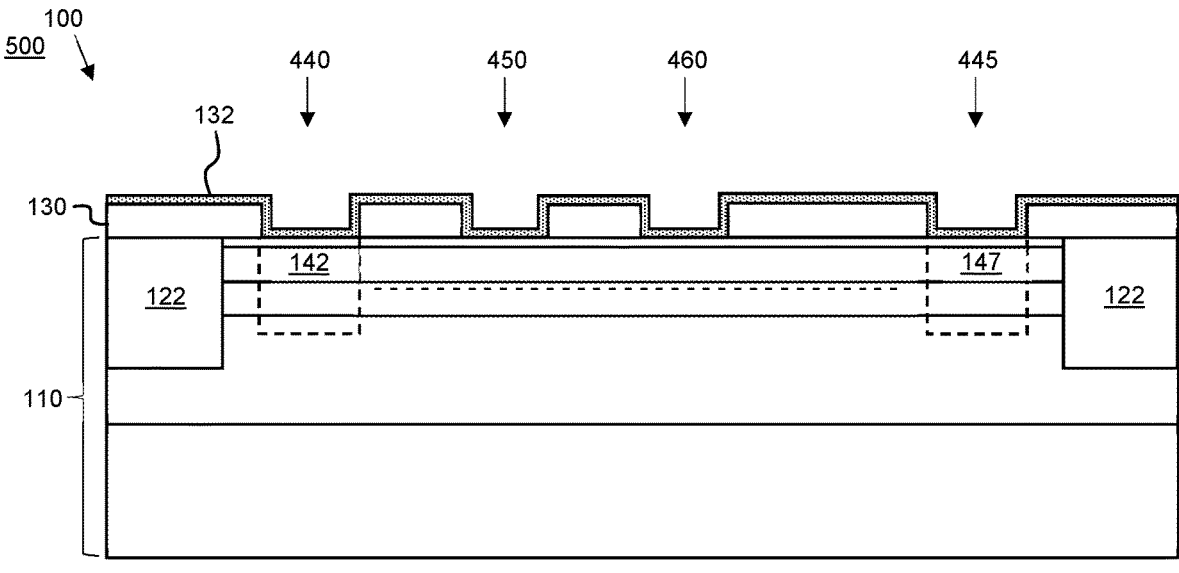
Figure 6A:
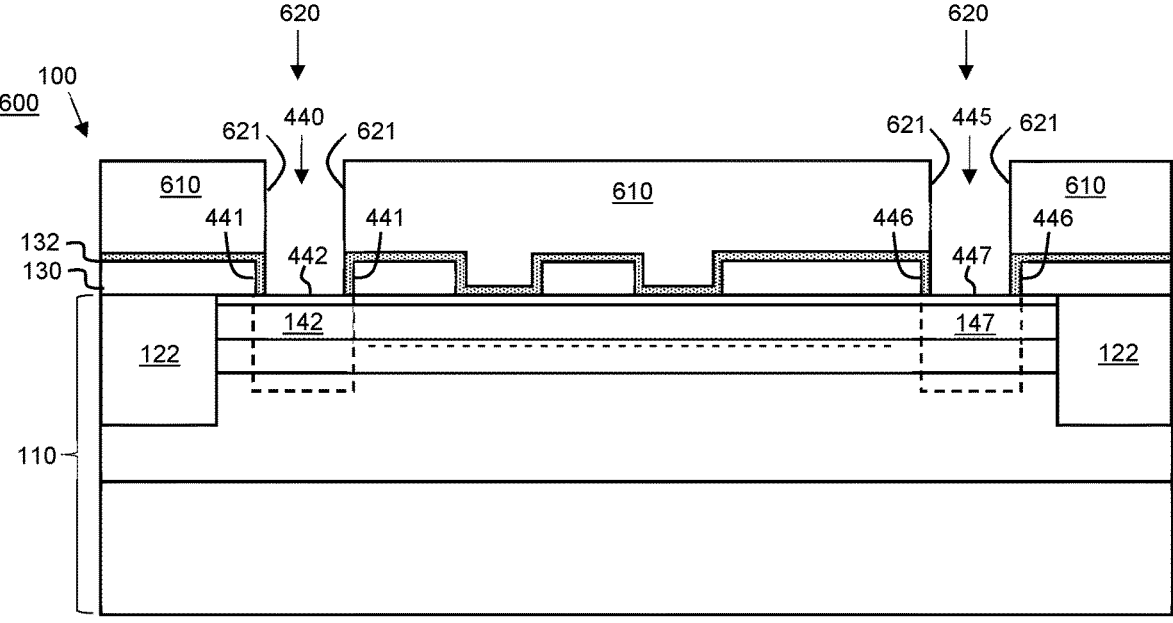
FIGS. 6A, 6B, 6C, and 6D are cross-sectional, side views of partially formed versions of the transistor of FIG. 1 illustrating various subsequent stages of fabrication, in accordance with one or more embodiments.
Figure 6B:
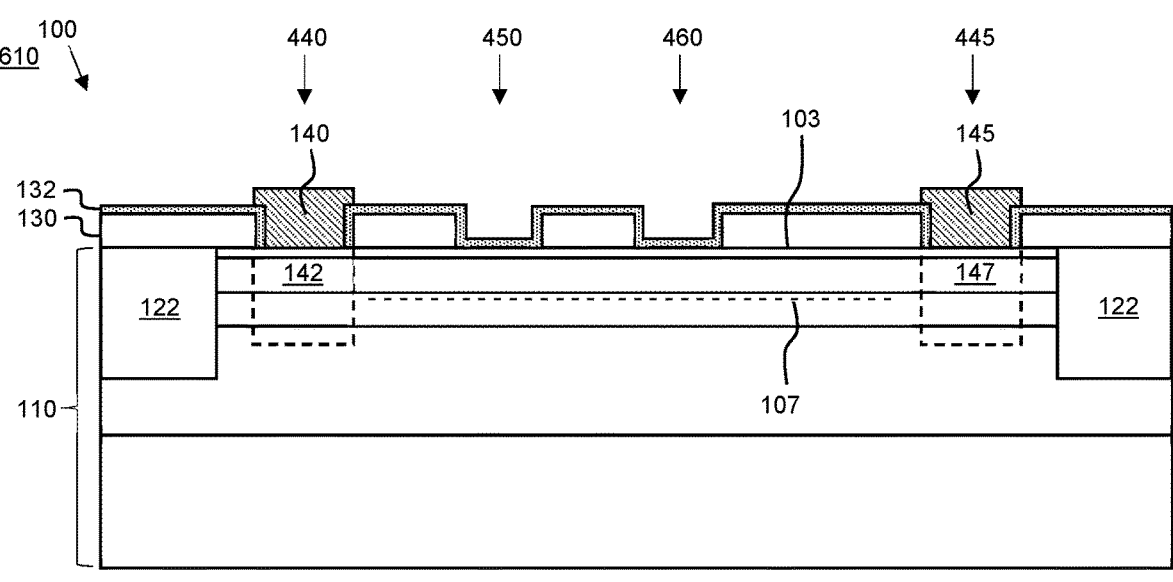

In addition, embodiments of the method of fabrication include lining the gate and field plate openings (e.g., openings 450, 460, FIG. 5) with portions of a thin conformal dielectric layer (e.g., layer 132, FIG. 5). These portions of the conformal dielectric layer function to protect the semiconductor surface within the gate and field plate openings during subsequent processing steps (e.g., while annealing the source and drain contacts during processing step 610, FIG. 6A). In addition, these portions of the conformal dielectric layer within the gate and field plate openings function as an etch stop during certain processing steps (e.g., while forming the gate spacers 151, FIGS. 6D, 7B). The gate spacers (e.g., spacers 151, FIG. 1), once formed, have underlying portions of the conformal dielectric layer. This gate spacer configuration enables the development of transistors with very short gate lengths (e.g., dimension 155, FIG. 1), which are capable of operating at increasingly high frequencies.

Further still, the various embodiments include a semiconductor device configuration in which the field plate (e.g., field plate 160, FIG. 1) is recessed below the surface of the lower dielectric layer (e.g., below the surface of passivation layer 130), while still being isolated from the surface of the semiconductor substrate by the conformal dielectric layer. This recessed configuration of the field plate results in a lower gate-to-drain capacitance, when compared with transistor designs that do not include a recessed field plate. All of these various features may result in improved high frequency gain and linearity.

Although examples of the various embodiments are described below with respect to gallium nitride (GaN) heterojunction field effect transistor (HFET) devices (e.g., device 100, FIG. 1), it should be noted that the various embodiments may be utilized in other types of transistors, transistors that have semiconductor substrates that do not include GaN (i.e., non-GaN-based transistors), and other types of non-transistor semiconductor devices that include features that benefit from reduced gate-to-field plate spacing. Accordingly, the various embodiments described herein are not limited to GaN HFET devices, but instead include transistors other than HFET transistors, non-GaN-based transistors, and semiconductor devices other than transistors.

FIG. 1 is a cross-sectional, side view of an exemplary GaN HFET device 100, in accordance with one or more embodiments. GaN HFET device 100 includes a semiconductor substrate 110, one or more isolation regions 120, an active region 125, first, second, and third dielectric layers 130, 132, 136, a source electrode 140 (i.e., "first current-carrying electrode"), a drain electrode 145 (i.e., "second current-carrying electrode"), a gate electrode 150 (i.e., "control electrode"), and a field plate 160. Various additional patterned conductive layers and dielectric layers (not shown) may be formed over dielectric layer 136 to provide for interconnection with bonding pads and other circuit elements.

The semiconductor substrate 110 may include a host substrate 102, a buffer layer 104 disposed on or over the host substrate 102, a channel layer 106 disposed on or over the buffer layer 104, a barrier layer 108 disposed on or over the channel layer 106, and an optional cap layer 109 disposed on or over the channel layer 106. A channel 107 is created in the form of a two-dimensional electron gas (2-DEG) within the channel layer 106 near the interface between the channel layer 106 and barrier layer 108.

In one or more embodiments, the host substrate 102 may include silicon carbide (SIC). In other embodiments, the host substrate 102 may include other materials such as sapphire, silicon (Si), GaN, aluminum nitride (AlN), diamond, poly-SiC, silicon on insulator, gallium arsenide (GaAs), indium phosphide (InP), and other substantially insulating or high resistivity materials. A nucleation layer (not shown) may be formed on an upper surface of the host substrate 102 between the buffer layer 104 and the host substrate 102. In an embodiment, the nucleation layer may include AlN.

Without departing from the scope of the inventive subject matter, it should be appreciated that the choice of materials and arrangement of layers to form the semiconductor substrate 110 is exemplary. It should be appreciated that the inclusion of the host substrate 102, the buffer layer 104, the channel layer 106, the barrier layer 108, and the cap layer 109 into the semiconductor substrate 110 is exemplary and that the function and operation of the various layers may be combined and may change depending on the materials used in any specific embodiment. For example, in some embodiments, the cap layer 109 may be omitted. In other embodiments using N-polar materials, the channel layer 106 may be disposed on or over the barrier layer 108 to create a 2-DEG and channel 107 directly beneath the cap layer 109 and the gate electrode 150. Still further embodiments may include semiconductor layers formed from materials including GaAs, gallium oxide ($Ga_2O_3$) aluminum gallium arsenide (AlGaAs), indium gallium arsenide (InGaAs), and aluminum indium arsenide (AllnAs) to form the semiconductor substrate 110.

High resistivity regions 122 may be formed in the semiconductor substrate 110 to define isolation regions 120 and an active region 125 above and along the upper surface 103 of the host substrate 102, according to an embodiment.

In various embodiments, multiple dielectric layers 130, 132, 136 may be formed on or over the active region 125 and isolation regions 120. Dielectric layer 130 may be referred to herein as "a passivation layer," or "a lower dielectric layer." Essentially, dielectric layer 130 (or passivation layer 130 or lower dielectric layer 130) may be formed from a single layer of dielectric material, or from multiple layers of dielectric material. Dielectric layer 132 may be referred to herein as "a conformal dielectric layer," where a "conformal dielectric layer," as used herein, means a dielectric layer that is deposited on or over vertical, horizontal, and intermediately angled surfaces of underlying layer(s) (e.g., on surfaces of layer 130). A "conformal dielectric layer" may have a substantially thickness on the vertical, horizontal, and intermediately angled surfaces upon which it is deposited. Finally, dielectric layer 136 may be referred to herein as "an upper dielectric layer." Similar to layer 130, dielectric layer 136 may be formed from a single layer of dielectric material, or from multiple layers of dielectric material.

In various embodiments, the source electrode 140 and the drain electrode 145 are formed over and contact source and drain regions 142, 147 in the active region 125 of semiconductor substrate 110. The source electrode 140 and the drain electrode 145 may be formed inside a source opening and a drain opening (e.g., openings 440, 445, FIG. 4), respectively, which extend through the lower dielectric layer 130. More particularly, the source and drain electrodes 140, 145 contact the semiconductor substrate 110 through the bottoms of the above-mentioned source and drain openings. For example, in one or more embodiments, the bottom extents of the source electrode 140 and the drain electrode 145 may be formed over and in contact with the cap layer 109. In other embodiments (not shown), one or both of the source electrode 140 and the drain electrode 145 may be recessed through the cap layer 109 and extend partially through the barrier layer 108, or one or both of the source electrode 140 and the drain electrode 145 may be fully recessed through the barrier layer 108 and in contact with the channel layer 104.

The source and drain electrodes 140, 145 may be formed from portions of a first conductive layer, which may include one or more conductive material sub-layers. The first (lowest) conductive layer, when annealed, results in the formation of ohmic contacts between the channel 107 and the below-described source and drain regions 142, 147. Accordingly, the first conductive layer may be referred to alternatively as an "ohmic layer" or "ohmic stack."

The source and drain regions 142, 147 correspond to portions of the semiconductor substrate 110 that underlie the source and drain electrodes 140, 145, respectively. In some embodiments, the source and drain regions 142, 147 may be not intentionally doped (NID) regions of the semiconductor substrate 110. In other embodiments, ion implantation or a diffusion process may be used to create intentionally-doped source and drain regions 142, 147.

In an embodiment, the gate electrode 150 is formed on or over the semiconductor substrate 110 in the active region 125, and between the source and drain electrodes 140, 145. According to one or more embodiments, the gate electrode 150 may have a T-shaped cross-section, as shown in FIG. 1. In such embodiments, the gate electrode 150 includes a conductive "stem" (e.g., stem 1053, FIG. 10) formed inside a gate opening (e.g., opening 450, FIG. 4). The stem extends through the lower dielectric layer 130 to contact the semiconductor substrate 110. The gate electrode 150 also includes first and second conductive protruding regions (e.g., regions 955, 956, FIG. 9) integrally-formed with the stem, which extend over portions of the lower dielectric layer 130.

According to one or more embodiments, portions of conformal dielectric layer 132 are located on sidewalls and portions of the bottom extent of the gate opening (e.g., gate opening 450, FIG. 4), and dielectric gate spacers 151 are formed on those portions of the dielectric layer 134. Accordingly, the stem of the gate electrode 150 is separated from sidewalls of dielectric layer 130 that are exposed through the gate opening by the dielectric gate spacers 151 and portions of dielectric layer 134 on those sidewalls of layer 130. Further, the protruding regions of the gate electrode 150 extend from the stem over the dielectric gate spacers 151 to contact the upper surface of dielectric layer 130.

The configuration of the gate electrode 150 over the dielectric gate spacers 151 and the portions of dielectric layer 132 and 130 within the gate opening enables device 100 to be designed with a very short gate length (i.e., dimension 155, corresponding to the cross-sectional size of the portion of the gate that contacts substrate 110), when compared with some conventional devices that lack these features. For example, embodiments of the inventive subject matter may be used to produce devices with gate lengths of less than 0.5 microns, or even less than 0.25 microns.

Without departing from the scope of the inventive subject matter, numerous other embodiments of gate structures may be realized. The exemplary embodiment of FIG. 1 depicts the gate electrode 150 as having a symmetrical T-shaped cross-section (i.e., with a vertical stem and symmetrical first and second protruding regions). In other embodiments, the gate electrode 150 may have an asymmetrical T-shaped cross-section.

The gate electrode 150 is electrically coupled to the channel 107 through the cap layer 109 (if included) and the barrier layer 108. In still other embodiments (not shown), the gate electrode 150 may be recessed through the cap layer 109 and extend partially into the barrier layer 108, increasing the electrical coupling of the gate electrode 150 to the channel 107. In still other embodiments (not shown), the cap layer 109 may be omitted and the gate electrode 150 may contact the barrier layer 108 directly. In still other embodiments (not shown), the gate electrode 150 may be disposed over a gate dielectric that is formed between the gate electrode 150 and the semiconductor substrate 110 to form a metal-insulator-semiconductor field effect transistor (MISFET) device. Either way, changes to the electric potential applied to the gate electrode 150 may shift the quasi Fermi level for the barrier layer 108 with respect to the quasi Fermi level for the channel layer 106, thereby modulating the electron concentration in the channel 107 within the semiconductor substrate 110 under the gate electrode 150.

The conductive field plate 160 is located within a field plate opening (e.g., opening 460, FIG. 4) through the lower dielectric layer 130. The field plate 160 is positioned adjacent to the gate electrode 150, and between the gate electrode 150 and the drain electrode 145.

According to one or more embodiments, the sidewalls and the bottom extent of the field plate opening are lined with portions of conformal dielectric layer 132, and the field plate 160 is formed from a portion of a conductive layer (e.g., layer 1210, FIG. 12), which is deposited into the field plate opening and onto those portions of conformal dielectric layer 132 within the field plate opening. Accordingly, the conductive field plate 160 is separated from the upper surface 109 of the semiconductor substrate 110. In addition, the bottom extent of the field plate 160 is recessed (i.e., positioned below) the upper surface of the lower dielectric layer 130.

The field plate 160 is electrically coupled to the source electrode 140 through a field plate-to-source connection 180. During operation of device 100, the field plate 160 may function to increase the capacitive coupling to the channel 107, reduce the electric field at the gate-drain edge, and reduce the associated gate-to-drain capacitance between the gate electrode 150 and the drain electrode 145.

The relative arrangement of the gate electrode 150 and the field plate 160 may be characterized by a gate-to-field plate spacing (e.g., dimension 165). As will be described in detail later, openings for the lower gate electrode 152 and for the field plate 160 (e.g., openings 450, 460, FIG. 4) are created simultaneously using a single patterned photoresist mask (e.g., mask 410, FIG. 4), and thus the two features 150, 160 are "self-aligned," which enables a reduction in the spacing 165 (distance) between the gate electrode 150 and the field plate 160 (i.e., the field plate-to-gate spacing), when compared with spacings that can be achieved using conventional gate and field plate structures and methods of their formation. In some embodiments, the gate-to-field plate spacing 165 may be between about 0.2 microns and about 0.5 microns, although the gate-to-field plate distance may be shorter or longer, as well.

A first metal-insulator-semiconductor region 167 may be created by the field plate 160, the underlying portion of dielectric layer 132, and the semiconductor substrate 110. In an embodiment, the first metal-insulator-semiconductor region 167 may act as part of the active device. The first metal-insulator-semiconductor region 167 has a first threshold voltage, which is dependent on characteristics of the lower dielectric layer 132 and the amount of charge in channel 107. In an embodiment, the first threshold voltage may be between about −5 volts and about −15 volts. In other embodiments, the first threshold voltage may be between about −4 volts and about −50 volts.

An upper dielectric layer 136 is disposed on or over the lower and conformal dielectric layers 130, 132, the source and drain electrodes 140 and 145, the gate electrode 150, and the field plate 160. Source metallization 185, drain metallization 186, and the above-mentioned field plate-to-source connection 180 are formed on or over the upper dielectric layer 136 from a conductive layer (e.g., layer 1210, FIG. 12). According to an embodiment, this conductive layer extends into source, drain, and field plate openings (e.g., openings 1140, 1145, 1160, FIGS. 11, 12) through upper dielectric layer 136 to contact the source electrode 140 and the drain electrode 145, and to form the field plate 160 and the field plate-to-source connection 180.

In some embodiments, the field plate-to-source connection 180 includes conductive straps 188, which are relatively-narrow conductors spaced along the transistor finger, and which extend, periodically, over the gate electrode 150 to electrically connect the field plate 160 to the source electrode 140. In other embodiments, connections between the field plate 160 and the source electrode 140 may be accomplished using another metal layer (e.g., an interconnect layer). In still other embodiments, rather than including conductive straps 188, the field plate-to-source connection 180 may include a solid, continuous conductive structure between the field plate 160 and the source electrode 140.

In an embodiment, GaN HFET device 100 may be configured as a transistor finger, in which the source electrode 140, the drain electrode 145, the gate electrode 150, and the field plate 160 may be configured as elongated, parallel elements. For example, in such a transistor finger, the length of the gate electrode 150 (i.e., dimension 155) is significantly smaller than a "width" of the gate electrode (i.e., a dimension perpendicular to the gate length). In some embodiments, the gate length may be between about 0.2 microns and about 2 microns, although the gate length may be shorter or longer, as well. In some embodiments, the gate width may be between about 4 microns and about 1000 microns, or longer.

Figure 2:
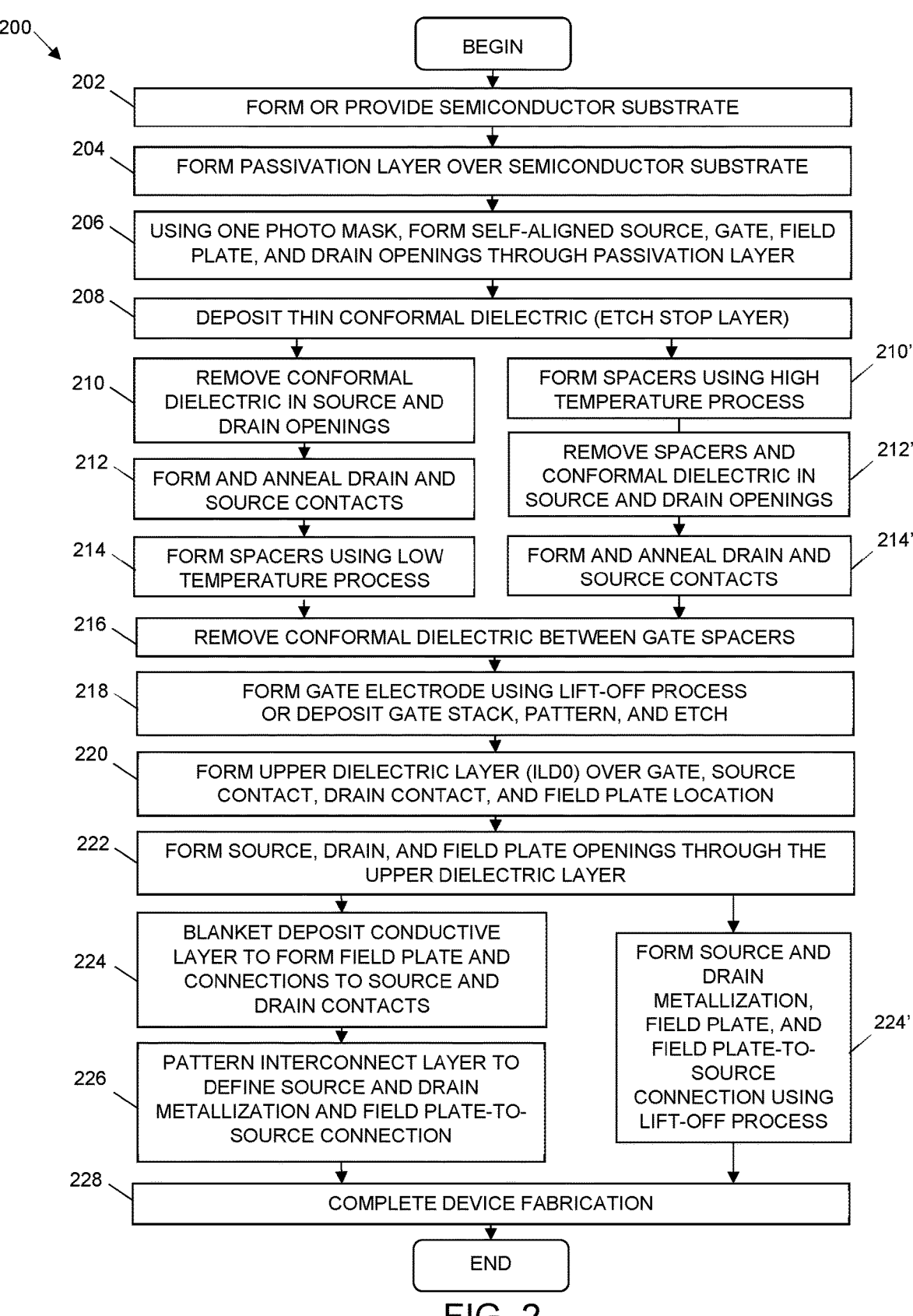
FIG. 2 is a process flow diagram for a method for fabricating the transistor of FIG. 1, in accordance with an embodiment.

Referring now to FIG. 2, flowchart 200 of FIG. 2 depicts an embodiment of a method for fabricating a semiconductor device (e.g., GaN HFET device 100, FIG. 1). FIG. 2 should be viewed alongside FIGS. 3-15, which illustrate cross-sectional, side views of a series of fabrication stages for producing the semiconductor device 100 of FIG. 1, in accordance with several example embodiments.

Figure 3:
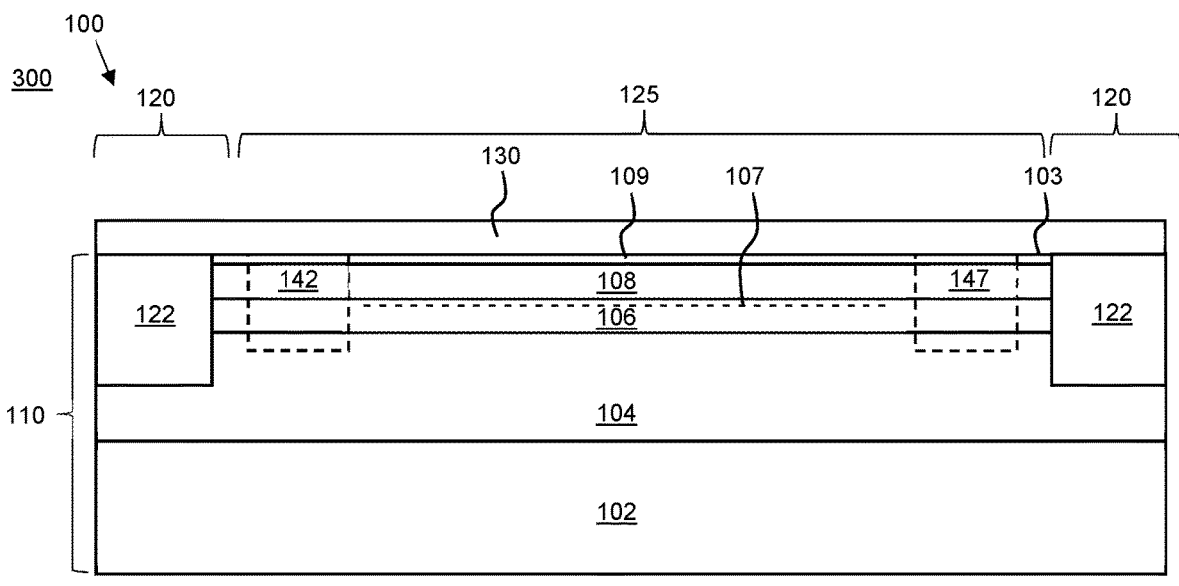
FIGS. 3, 4, and 5 are cross-sectional, side views of partially formed versions of the transistor of FIG. 1 illustrating various stages of fabrication, in accordance with one or more embodiments.

The method may begin in block 202 of FIG. 2, and as depicted in fabrication stage 300 of FIG. 3, by forming or providing a semiconductor substrate 110. In an embodiment, stage 300 may include providing a host substrate 102, and forming a number of semiconductor layers 104, 106, 108, and 109 (described in detail below) on or over the host substrate 102. The semiconductor layers 104, 106, 108, and 109 may be grown using one of metal-organic chemical vapor deposition (MOCVD), molecular beam epitaxy (MBE), hydride-vapor phase epitaxy (HVPE) or a combination of these techniques, although other suitable techniques may alternatively be used.

As mentioned above, according to one or more embodiments, the host substrate 102 may include silicon carbide (SiC). In other embodiments, the host substrate 102 may include other materials such as sapphire, silicon (Si), GaN, aluminum nitride (AlN), diamond, poly-SiC, silicon on insulator, gallium arsenide (GaAs), indium phosphide (InP), and other substantially insulating or high resistivity materials.

A nucleation layer (not shown) may be formed on an upper surface of the host substrate 102 between the buffer layer 104 and the host substrate 102. In an embodiment, the nucleation layer may include AlN.

The buffer layer 104 may include a number of group III-N semiconductor layers formed on or over the host substrate 102. Each of the semiconductor layers of the buffer layer 104 may include an epitaxially grown group III-nitride epitaxial layer. The group-III nitride epitaxial layers that make up the buffer layer 104 may be nitrogen (N)-face or gallium (Ga)-face material, for example. For example, the buffer layer 104 may include at least one AlGaN mixed crystal layer having a composition denoted by $Al_XGa_{1-X}N$ with an aluminum mole fraction, X, which can take on values between 0 and 1. The total thickness of the buffer layer 104 with all of its layers may be between about 200 angstroms and about 100,000 angstroms although other thicknesses may be used. A limiting X value of 0 yields pure GaN while a value of 1 yields pure aluminum nitride (AlN). Some embodiments may include a buffer layer 104 disposed on or over the host substrate and nucleation layer (not shown).

The buffer layer 104 may include additional $Al_XGa_{1-X}N$ layers. The thickness of the additional $Al_XGa_{1-X}N$ layer(s) may be between about 200 angstroms and about 50,000 angstroms though other thicknesses may be used. In an embodiment, the additional $Al_XGa_{1-X}N$ layers may be configured as GaN (X=0) where the $Al_XGa_{1-X}N$ is not intentionally doped (NID). The additional $Al_XGa_{1-X}N$ layers may also be configured as one or more GaN layers where the one or more GaN layers are intentionally doped with dopants that may include iron (Fe), chromium (Cr), carbon (C) or other suitable dopants that render the buffer layer 104 substantially insulating or high resistivity. The dopant concentration may be between about $-10^{16}$ cm$^{-3}$ and $10^{19}$ cm$^{-3}$ though other higher or lower concentrations may be used. The additional $Al_XGa_{1-X}N$ layers may be configured with X=0.01 to 0.10 where the $Al_XGa_{1-X}N$ is NID or, alternatively, where the $Al_XGa_{1-X}N$ is intentionally doped with Fe, Cr, C, or other suitable dopant species. In other embodiments (not shown), the additional layers may be configured as a superlattice where the additional layers include a series of alternating NID or doped $Al_XGa_{1-X}N$ layers where the value of X takes a value between 0 and 1. In still other embodiments, the buffer layer 104 may also include one or more indium gallium nitride (InGaN) layers, with composition denoted $In_YGa_{1-Y}N$, where Y, the indium mole fraction, may take a value between 0 and 1. The thickness of the InGaN layer(s) may be between about 50 angstroms and about 2000 angstroms, though other thicknesses may be used.

In other embodiments, the semiconductor layers of the buffer layer 104 may not be epitaxially grown. In still other embodiments, the semiconductor layers of the buffer layer 104 may include Si, GaAs, InP, or other suitable materials.

In an embodiment, a channel layer 106 may be formed on or over the buffer layer 104. The channel layer 106 may include one or more group III-N semiconductor layers. The channel layer 106 may include an $Al_XGa_{1-X}N$ layer where X takes on values between 0 and 1. In an embodiment, the channel layer 106 is configured as GaN (X=0) although other values of X may be used without departing from the scope of the inventive subject matter. The thickness of the channel layer 106 may be between about 50 angstroms and about 10,000 angstroms though other thicknesses may be used. The channel layer 106 may be NID or, alternatively, may include Si, germanium (Ge), C, Fe, Cr, or other suitable dopants. The dopant concentration may be between about $10^{15}$ cm$^{-3}$ and about $10^{19}$ cm$^{-3}$ though other higher or lower concentrations may be used. In other embodiments, the channel layer 106 may include NID or doped $In_YGa_{1-Y}N$, where Y, the indium mole fraction, may take a value between 0 and 1.

In an embodiment, a barrier layer 108 may be formed on or over the channel layer 106. The barrier layer 108 may include one or more group III-N semiconductor layers. In some embodiments, the barrier layer 108 has a larger bandgap and larger spontaneous polarization than the channel layer 106 and, when the barrier layer 108 is in direct contact with the channel layer 106, a channel 107 is created in the form of a two-dimensional electron gas (2-DEG) within the channel layer 106 near the interface between the channel layer 106 and barrier layer 108. In addition, strain between the barrier layer 108 and channel layer 106 may cause additional piezoelectric charge to be generated and lead to the formation of the 2-DEG and channel 107. The barrier layer 108 may include at least one NID $Al_XGa_{1-X}N$ layer where X takes on values between 0 and 1. In some embodiments, X may take a value of 0.1 to 0.35, although other values of X may be used. The thickness of the barrier layer 108 may be between about 50 angstroms and about 1000 angstroms though other thicknesses may be used. The barrier layer 108 may be NID or, alternatively, may include Si, Ge, C, Fe, Cr, or other suitable dopants. The dopant concentration may be between about $10^{16}$ $cm^{-3}$ and $10^{19}$ $cm^{-3}$ though other higher or lower concentrations may be used.

In an embodiment, an additional AlN interbarrier layer (not shown) may be formed between the channel layer 106 and the barrier layer 108, according to an embodiment. The AlN interbarrier layer may increase the channel charge and improve the electron confinement of the resultant 2-DEG, while also increasing the charge mobility.

In other embodiments, the barrier layer 108 may include indium aluminum nitride (InAlN) layers, denoted $In_YAl_{1-Y}N$, where Y, the indium mole fraction, may take a value between about 0.1 and about 0.2 though other values of Y may be used. In the case of an InAlN barrier, the thickness of the barrier layer 108 may be between about 30 angstroms and about 1000 angstroms though other thicknesses may be used. In the case of using InAlN to form the barrier layer 108, the InAlN may be NID or, alternatively, may include Si, Ge, C, Fe, Cr, or other suitable dopants. The dopant concentration may be between about $10^{16}$ $cm^{-3}$ and about $10^{19}$ $cm^{-3}$ though other higher or lower concentrations may be used.

In one or more embodiments, a cap layer 109 may be formed on or over the barrier layer 108. The cap layer 109 may present a stable surface for the semiconductor substrate 110 and may protect the surface of the semiconductor substrate 110 from chemical and environmental exposure incident to wafer processing. The cap layer 109 may include one or more group III-N semiconductor layers. In an embodiment, the cap layer 109 is GaN. The thickness of the cap layer 109 may be between about 5 angstroms and about 100 angstroms though other thicknesses may be used. The cap layer 109 may be NID or, alternatively, may include Si, Ge, C, Fe, Cr, or other suitable dopants. The dopant concentration may be between about $10^{16}$ $cm^{-3}$ and $10^{19}$ $cm^{-3}$ though other higher or lower concentrations may be used.

In some embodiments, intentionally-doped source and drain regions 142, 147 may be formed through the upper surface 103 of the semiconductor substrate 110 during stage 300 or later. For example, an implant mask (not shown) may be formed on the upper surface 103 of the semiconductor substrate 110, and openings may be formed in the mask to expose areas of the upper surface 103 where the source and drain regions 142, 147 are to be formed. An ion implantation process may then be performed to implant dopant species into the exposed areas, thus producing doped source and drain regions 142, 147. In various embodiments, Si, Ge, O, or another suitable n-type dopant may be implanted into the semiconductor substrate 110 through the implant mask. According to an embodiment, the dopant species may be activated by annealing the semiconductor substrate 110 using an activation annealing process. Alternatively, in other embodiments, the source and drain regions 142, 147 may be NID regions of the semiconductor substrate 110.

In some embodiments, high resistivity regions 122 may be formed through the upper surface 103 of the semiconductor substrate 110 during stage 300 or later. For example, the high resistivity regions 122 may be formed by dispensing and patterning a photoresist layer on or over upper surface 103 of the semiconductor substrate 110, and then defining openings in the photoresist layer in the desired locations of the high resistivity regions 122. As used herein, the term "photoresist mask" refers to a patterned photoresist layer. Using ion implantation, a dopant species (e.g., one or more of oxygen, nitrogen, boron, arsenic, helium, and/or argon) may be driven into the semiconductor substrate 110 to create the high resistivity regions 122. In an embodiment, the energy and dose of the implant may be configured to create a sufficient amount of damage in the crystal structure of the semiconductor substrate 110 such that the semiconductor substrate is substantially high resistivity or semi-insulating within the high resistivity regions 122. In other embodiments (not shown), forming the high resistivity regions 122 may include, first, etching some or all of the semiconductor layers in the semiconductor substrate 110 and then ion implanting to enhance the resistivity in the remaining semiconductor layers and/or the host substrate 102. The photoresist mask is removed before proceeding to the next fabrication stage.

In block 204 of FIG. 2, and as also depicted in fabrication stage 300 of FIG. 3, the method may continue by forming lower dielectric layer 130 (e.g., a surface passivation layer) on or over the upper surface 103 of the semiconductor substrate 110. The lower dielectric layer 130 may include one or more dielectric layers, and thus layer 130 may be referred to as "one or more lower dielectric layers." The dielectric layer(s) may be formed using one or more processes selected from low pressure chemical vapor deposition (LPCVD), atomic layer deposition (ALD), sputtering, physical vapor deposition (PVD), MBE, chemical vapor deposition (CVD) (including plasma-enhanced (PE) CVD, MOCVD, catalytic CVD, hot wire (HW) CVD, inductively coupled plasma (ICP) CVD, and electron-cyclotron resonance (ECR) CVD), a combination of these or other suitable dielectric deposition technique(s).

The lower dielectric layer 130 may be formed from one or more suitable dielectric materials including silicon dioxide ($SiO_2$), silicon nitride (SiN), silicon oxynitride (SiON), aluminum oxide ($AlO_2$ or $Al_2O_3$), aluminum nitride (AlN), and hafnium oxide ($HfO_2$), though other substantially insulating materials may be used. The lower dielectric layer 130 may have a thickness of between 200 angstroms and 1000 angstroms. In other embodiments, the lower dielectric layer 130 may have a thickness of between 50 angstroms and 10,000 angstroms, though other thicknesses may be used.

Figure 4:
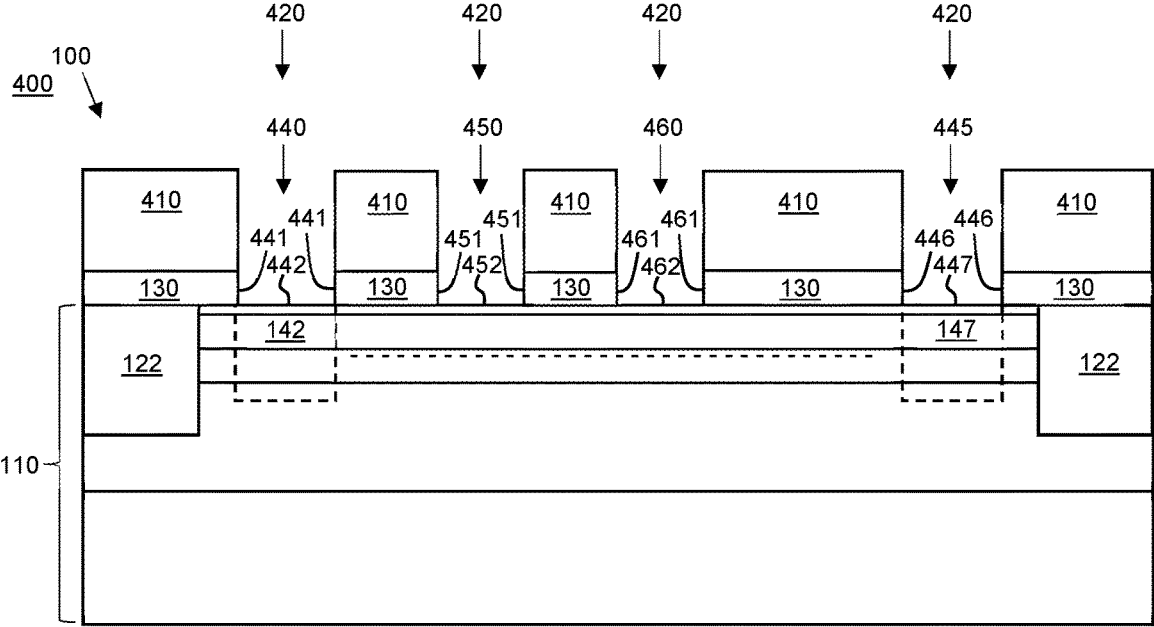

In block 206 of FIG. 2, and as depicted in fabrication stage 400 of FIG. 4, the method may continue by forming source, drain, gate, and field plate openings 440, 445, 450, 460 through the lower dielectric layer 130. According to one or more embodiments, the source, drain, gate, and field plate openings 440, 445, 450, 460 are created simultaneously using a single patterned photoresist mask. This ensures that the to-be-formed source and drain contacts 140, 145, the gate electrode 150, and the field plate 160 are "self-aligned" with each other, which ensures consistent performance of each device despite process variations, and enables devices with a shorter gate-to-field plate spacing 165 (FIG. 1).

To create the source, drain, gate, and field plate openings 440, 445, 450, 460, a photoresist layer 410 is deposited on or over the lower dielectric layer 130, and the photoresist layer 410 is patterned to form photoresist openings 460 over the source and drain regions 142, 147, and over the ultimate locations of the gate electrode 150 and field plate 160. These openings 460 expose the upper surface of the lower dielectric layer 130. The source, drain, gate, and field plate openings 440, 445, 450, 460 through the lower dielectric layer 130 then may be created by etching through the lower dielectric layer 130 in areas exposed by the photoresist openings 460, while stopping at the upper surface 103 of the base substrate 110.

Etching the lower dielectric layer 130 preferably includes performing an anisotropic etching process, which results in openings 440, 445, 450, 460 being defined by substantially-vertical sidewalls 441, 446, 451, 461 (of layer 130) and substantially-horizontal bottom extents 442, 447, 452, 462 (exposing substrate 110). For example, the etching process may include one or more dry etching processes, such as reactive ion etching (RIE), ICP etching, ECR etching, or another suitable dry etching process. According to one or more embodiments, suitable dry etching techniques may use one or more of sulphur hexafluoride ($SF_6$), di-carbon hexafluoride ($C_2F_6$), carbon tetrafluoride ($CF_4$), tri-fluoromethane ($CHF_3$) or other chemistries. The photoresist mask 410 may be removed after forming the source, drain, gate, and field plate openings 440, 445, 450, 460.

In block 208 of FIG. 2, and as depicted in fabrication stage 500 of FIG. 5, the method may continue by depositing conformal dielectric layer 132 on or over the upper surface of dielectric layer 130, sidewalls 441, 446, 451, 461 and bottom extents 442, 447, 452, 462 of the source, drain, gate, and field plate openings 440, 445, 450, 460 (i.e., sidewalls of layer 130 and exposed portions of substrate 110 within openings 440, 445, 450, 460). The conformal dielectric layer 132 desirably is deposited using a deposition technique that results in a very conformally deposited layer (i.e., a layer having substantially the same thickness on vertical, horizontal, and intermediately-angled surfaces). As will be described in more detail later, this makes conformal dielectric layer 132 suitable for use to protect some portions of the surface of substrate 110 during some processes (e.g., during anneal of the source and drain contacts 140, 145, FIG. 6B), and as an etch stop during certain etching processes (e.g., during fabrication stages 630, 720, FIGS. 6D, 7B). For example, according to one or more embodiments, the conformal dielectric layer 132 may be deposited using atomic layer deposition (ALD) or another suitable conformal deposition technique such as plasma enhanced chemical vapor deposition (PECVD).

The conformal dielectric layer 132 has first portions formed on sidewalls 451 of the gate opening 450, second portions formed on sidewalls 461 of the field plate opening 460, and a third portion formed on the semiconductor substrate 110 at a bottom extent 462 of the field plate opening 460. In addition, the conformal dielectric layer 132 has a fourth portion formed on the semiconductor substrate 110 at a bottom extent 452 of the gate opening 450. Further, the conformal dielectric layer 132 includes fifth portions formed on sidewalls 441 of the source opening 440, and sixth portions formed on sidewalls 446 of the drain opening 445. Further still, the conformal dielectric layer 132 also includes a seventh portion formed over an upper surface of the lower dielectric layer 130, which extends from one of the fifth portions formed on the sidewalls 441 of the source opening 440 to one of the first portions formed on the sidewalls 451 of the gate opening 450. Finally, the conformal dielectric layer 132 also includes an eighth portion formed over the upper surface of the lower dielectric layer 130, which extends from another one of the first portions formed on the sidewalls 451 of the gate opening 450 to one of the second portions formed on the sidewalls 461 of the field plate opening 460.

The conformal dielectric layer 132 may be formed from one or more suitable dielectric materials. For example, suitable materials for the conformal dielectric layer 132 include one or more materials selected from aluminum oxide ($AlO_2$ or $Al_2O_3$), and aluminum nitride (AlN), though other substantially insulating materials may be used. The conformal dielectric layer 132 preferably is relatively thin. For example, layer 132 may have a thickness of between 50 angstroms and 400 angstroms (e.g., about 100 angstroms). In other embodiments, the conformal dielectric layer 132 may have a thickness greater or less than the above-given range.

At this point, the drain and source contacts 140, 145 are formed within the drain and source openings 440, 445, respectively. In addition, the gate spacers 151 also are formed. Various different process sequences may be used to complete formation of the drain and source contacts 140, 145 and the gate spacers 151. Blocks 210, 212, and 214 (corresponding to fabrication stages 600, 610, 620, 630, FIGS. 6A-6D) are used to describe a first process sequence for forming these features 140, 145, 151. Blocks 210', 212', and 214' (corresponding to fabrication stages 700, 720, 730, 740, FIGS. 7A, 7B, 7C, and 7D) are used later in this description to describe a second process sequence for forming these features 140, 145, 151.

The first process sequence (blocks 210, 212, and 214) will now be described. According to one or more first embodiments, in block 210 of FIG. 2, and as depicted in fabrication stage 600 of FIG. 6A, the first process sequence includes removing portions of conformal dielectric layer 132 at the bottom extents 442, 447 of the source and drain openings 440, 445, in order to re-expose the upper surface of the semiconductor substrate 110 within those openings 440, 445 prior to ohmic contact formation.

To remove the portions of conformal dielectric layer 132 at the bottom extents 442, 447 of the source and drain openings 440, 445, a photoresist layer 610 is deposited on or over the conformal dielectric layer 132, and the photoresist layer 610 is patterned to form photoresist openings 620 over the source and drain regions 142, 147. As shown in FIG. 6, the vertical sidewalls 621 of the photoresist openings 620 may be co-planar with the vertical sidewalls of the portions of the conformal dielectric layer 132 that are located on the sidewalls 441, 446 of the source and drain openings 440, 445. This arrangement provides protection for those portions of the conformal dielectric layer 132 on the sidewalls 441, 446 during a subsequent etching process, while exposing the portions of the conformal dielectric layer 132 at the bottom extents 442, 447 of the source and drain openings 440, 445.

The portions of the conformal dielectric layer 132 at the bottom extents 442, 447 of the source and drain openings 440, 445 then may be removed by etching through portions of layer 132 that are exposed by the photoresist openings 620, while stopping at or slightly below the upper surface 103 of the base substrate 110. A relatively small recess into the upper surface 103 of the base substrate 110 may be acceptable or desirable for the to-be-formed ohmic contacts.

Etching the exposed portions of the conformal dielectric layer 132 may include using one or more wet and/or dry etching processes and chemistries. For example, in some embodiments, the etching process may include a wet etch using hydrofluoric acid (HF) or buffered oxide etch (BOE).

In other embodiments, the etching process may include a chlorine plasma etch. Other suitable etching processes and chemistries alternatively may be used. Essentially, the etching process results in complete removal of the portions of the conformal dielectric layer 132 at the bottom extents 442, 447 of the source and drain openings 440, 445, as shown in FIG. 6. In some embodiments, the portions of the conformal dielectric layer 132 on the sidewalls 441, 446 may remain substantially intact, while in other embodiments, some or all of those portions of the conformal dielectric layer 132 may be removed by the etching process. Upon completion of the etching process, photoresist layer 610 is removed.

Next, the first process sequence includes forming an annealing the drain and source contacts 140, 145 (block 212), and subsequently forming the gate spacers 151 (block 214). In block 212 of FIG. 2, and as depicted in fabrication stage 610 of FIG. 6B, forming the source and drain contacts 140, 145 first includes depositing constituent layers of an ohmic stack over the surface of the conformal dielectric layer 132 and into the source and drain openings 440, 445, and subsequently patterning the ohmic stack to remove all but portions of the ohmic stack that was deposited into the source and drain openings 440, 445.

Alternatively, forming the source and drain contacts 140, 145 may be performed using a lift-off process, in which a photoresist layer (not shown) is applied over the surface of the conformal dielectric layer 132, and the photoresist is patterned to expose the source and drain openings 440, 445. Constituent layers of an ohmic stack are then deposited over the remaining photoresist mask and into the source and drain openings 440, 445, and then photoresist mask is removed, resulting in portions of the ohmic stack that are deposited on the photoresist mask being removed.

In various embodiments, the constituent layer(s) of the ohmic stack may be deposited by sputtering, evaporation, PVD, PECVD, or other suitable deposition techniques. In one or more embodiments, the ohmic stack may contain one or more conductive layers that include titanium (Ti), Al, titanium nitride (TiN), gold (Au), molybdenum (Mo), nickel (Ni), Si, Ge, platinum (Pt), tantalum (Ta), and/or other suitable materials. In other embodiments, the conductive layer(s) of the ohmic stack may include titanium-tungsten (TiW), titanium-aluminum (TiAl), or titanium-tungsten nitride (TiWN). In one or more specific embodiments, the ohmic stack may include a stack deposited into the source and drain openings 440, 445 that includes a Ti layer on the surface 103 of the substrate 110, an Al on or over the Ti layer, and a TiN layer on or over the Ti layer. For example, the Ti layer may be between about 10 angstroms and about 200 angstroms thick, the Al layer may be between about 100 angstroms and about 1500 angstroms thick, and the TiN layer may be between about 200 angstroms and about 2000 angstroms thick, although other thicknesses alternatively may be used. In other embodiments, other metals may be substituted for or placed additionally below or on top of the constituent layers of the ohmic stack (e.g., Mo, or Pt may be substituted for TiN, or Ta may be used in addition to Ti, above or below Ti, or substituted for Ti).

After depositing the constituent layers of the ohmic stack, an annealing process may be performed to alloy the ohmic stack, resulting in ohmic contacts to the source and drain regions 142 and 147 of the semiconductor substrate 110 (i.e., to the 2-DEG of the channel 107). It should be noted here that the conformal dielectric layer 132, having been deposited over the upper surface 103 of the substrate 110 at the bottom extents of the gate and field plate openings 450, 460, acts to protect the surface of the substrate 110 within openings 450, 460 during the annealing process. Otherwise, without these protective portions of the conformal dielectric layer 132 within the gate and field plate openings 450, 460, the high temperature of the annealing process may result in contamination of the channel 107. Accordingly, the conformal dielectric layer 132 has the beneficial effect of enabling the source and drain contacts 140, 145 to be subject to annealing at very high temperatures without contaminating the channel 107 at this stage of fabrication.

In an embodiment, the annealing step may be accomplished by rapid thermal annealing. For example, the ohmic stack may be alloyed at a temperature of between about 400 degrees Celsius and about 700 degrees Celsius for between about 15 seconds and about 60 seconds. In other embodiments the ohmic stack may be annealed at between about 300 degrees Celsius and about 900 degrees Celsius for between about 10 seconds and about 600 seconds, though other higher or lower temperatures and/or times may be used.

To complete the formation of the source and drain contacts 140, 145, the annealed ohmic stack is then patterned to form the source and drain electrodes 140 and 145. More specifically, a photoresist layer (not illustrated) may be deposited over the ohmic stack, and the photoresist layer is patterned to form photoresist openings over portions of the ohmic stack outside of the desired locations of the source and drain electrodes 140, 145. Said another way, the photoresist layer is patterned to protect portions of the ohmic stack within the source and drain openings 440, 445. Portions of the ohmic stack that are exposed through the openings in the photoresist layer are then removed by etching through the ohmic stack, while stopping at the upper surface of the lower dielectric layer 130. Etching the ohmic stack preferably includes performing a well-controlled dry etching process, such as RIE, ICP etching, ECR etching, or other suitable dry etching processes. In an alternate embodiment, a suitable wet chemical etching process may be performed. The etching process results in the formation of the source and drain electrodes 140, 145.

Figure 6C:
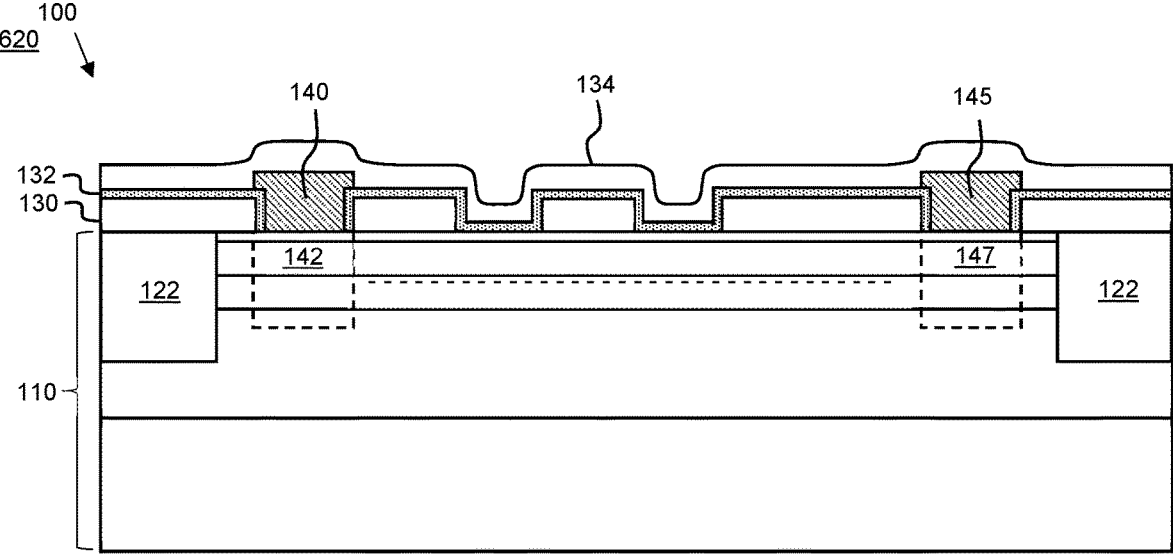

In block 214 of FIG. 2, and as depicted in fabrication stages 620 and 630 of FIGS. 6C and 6D, the method may continue by forming the gate spacers 151 (along with field plate spacers 161, which are subsequently removed). According to one or more embodiments, as shown in FIG. 6C and fabrication stage 620, this includes first blanket depositing a dielectric spacer layer 134 (i.e., a dielectric layer that is suitable for forming the spacers 151) on or over the conformal dielectric layer 132 and the source and drain electrodes 140, 145. The dielectric spacer layer 134 desirably is deposited using a low-temperature deposition technique (e.g., about 300 degrees Celsius) that can be performed in the presence of exposed metal (i.e., the exposed surfaces of the source and drain contacts 140, 145. For example, according to one or more embodiments, the dielectric spacer layer 134 may be deposited using PVD, PECVD or another suitable deposition technique. Other deposition techniques that should not be used in the presence of exposed metal should be avoided (e.g., LPCVD).

The dielectric spacer layer 134 may be formed from one or more suitable dielectric materials. The dielectric material(s) selected for the dielectric spacer layer 134 is/are different from the dielectric material(s) selected for the conformal dielectric 132 so that layer 132 may function as an etch stop during a subsequent process (i.e., fabrication stage 630, FIG. 6D) of etching the dielectric spacer layer 134. For example, suitable materials for the dielectric spacer layer 134 include SiN and/or one or more other suitable materials.

Figure 6D:
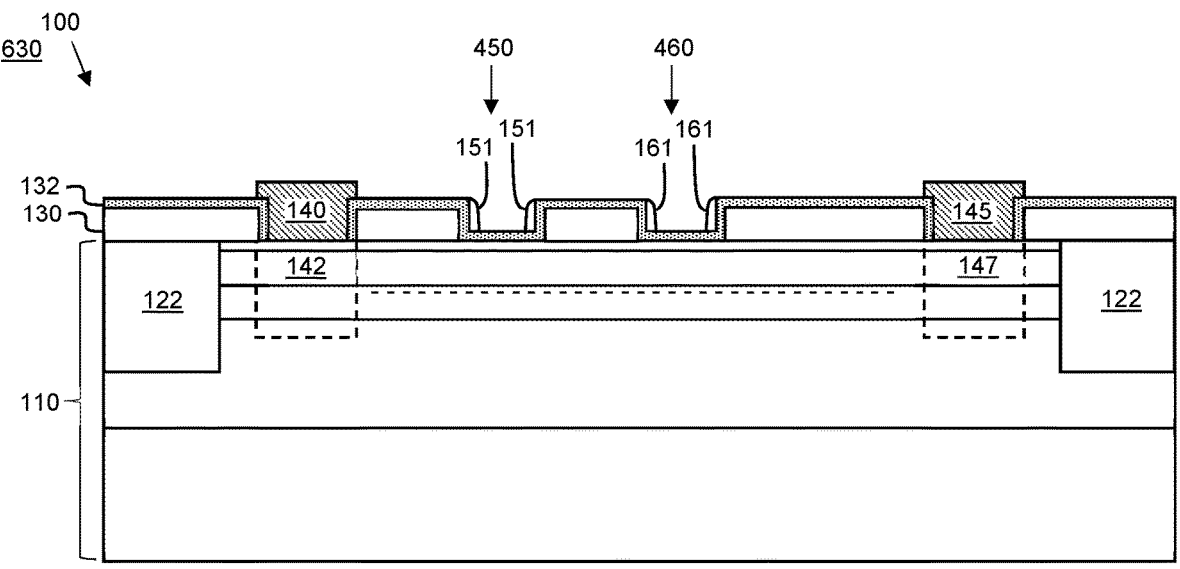

Referring now to FIG. 6D and fabrication stage 630, after depositing dielectric spacer layer 134, an etching process is then performed on the dielectric spacer layer 134 to form the gate spacers 151 and, in some embodiments, field plate spacers 161. According to one or more embodiments, the etching process includes an anisotropic etching process, which removes the material of dielectric spacer layer 134 in a substantially vertical direction. The etching process is highly selective to the dielectric material of the conformal dielectric layer 132 (i.e., the process does not significantly remove the material of layer 132), and thus the etching process stops when the dielectric spacer layer 134 has been fully removed from all horizontal surfaces of the conformal dielectric layer 132, while remaining on the vertical surfaces of the conformal dielectric layer 132 within the gate and field plate openings 450, 460. This results in the formation of the gate and field plate spacers 151, 161. For example, the etching process may include one or more dry etching processes, such as reactive ion etching (RIE), ICP etching, ECR etching, or another suitable dry etching process. According to one or more embodiments, suitable dry etching techniques may use one or more of sulphur hexafluoride (SF$_6$), di-carbon hexafluoride (C$_2$F$_6$), carbon tetrafluoride (CF$_4$), tri-fluoromethane (CHF$_3$) or other chemistries. It may be noted here that the inclusion of the gate spacers 151 enables device designs with shorter gate lengths (i.e., dimension 155, FIG. 1) than are achievable using conventional photolithography processes.

As mentioned earlier, a second and different process sequence may be used to form the source and drain contacts 140, 145 and the gate spacers 151. More particularly, blocks 210', 212', and 214' alternatively may be used to form these features 140, 145, 151. The primary difference between these two process sequences is that, whereas the first process sequence (corresponding to blocks 210, 212, and 214) may utilize a low-temperature material deposition process (e.g., PVD, PECVD) for depositing the dielectric spacer layer 134, the below-described, second process sequence (corresponding to blocks 210', 212', and 214') may utilize a high-temperature material deposition process (e.g., LPCVD).

Figure 7A:
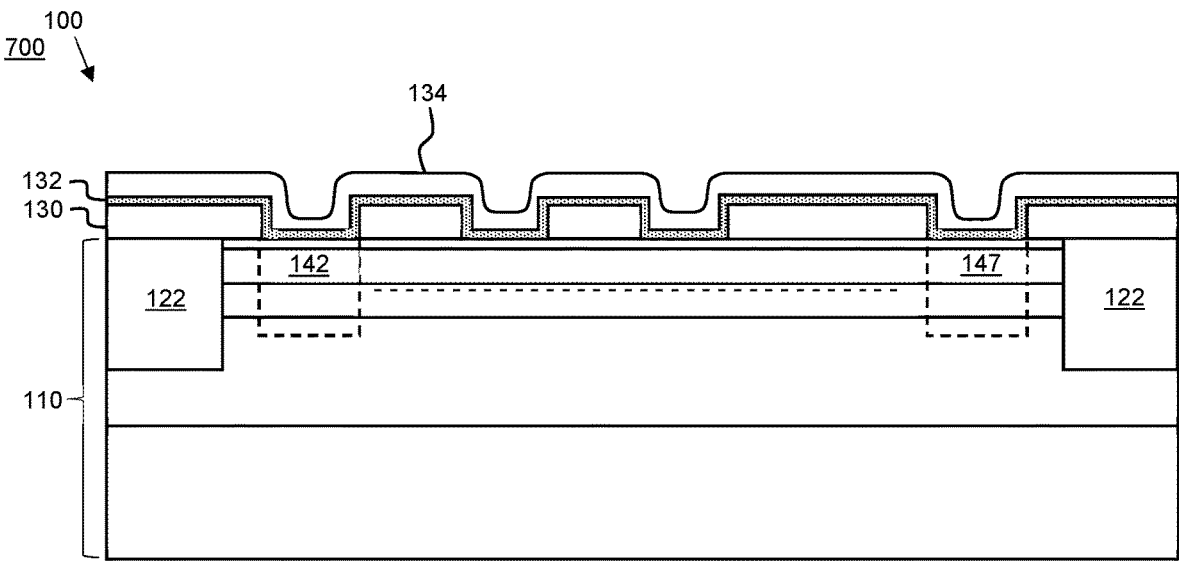
FIGS. 7A, 7B, 7C, and 7D are cross-sectional, side views of partially formed versions of the transistor of FIG. 1 illustrating alternate embodiments of the fabrication stages shown in FIGS. 6A-6D.

Moving now to blocks 210', 212', and 214', and according to one or more second embodiments, the second process sequence includes first forming gate spacers 151 (block 210'), preparing the source and drain openings 440, 445 for ohmic contact formation (block 212'), and subsequently forming and annealing the drain and source contacts 140, 145 (block 214'). In block 210' of FIG. 2, and as depicted in fabrication stages 700 and 720 of FIGS. 7A and 7B, the method may proceed by forming gate spacers 151 (along with field plate spacers 161, source spacers 742, and drain spacers 747, which are subsequently removed). According to one or more embodiments, as depicted in FIG. 7A and fabrication stage 700, this includes first blanket depositing a dielectric spacer layer 134 (i.e., a dielectric layer that is suitable for forming the spacers 151) on or over the conformal dielectric layer 132. The dielectric spacer layer 134 desirably may be deposited using a high-temperature deposition technique (e.g., about 700-800 degrees Celsius), since the source and drain contacts 140, 145 have not yet been formed (i.e., there is no exposed metal during this process). For example, according to one or more embodiments, the dielectric spacer layer 134 may be deposited using LPCVD or another suitable high-temperature deposition technique.

Again, the dielectric spacer layer 134 may be formed from one or more suitable dielectric materials. For example, suitable materials for the dielectric spacer layer 134 include SiN and/or one or more other suitable materials. The dielectric spacer layer 134 may have a thickness of between 200 angstroms and 2000 angstroms. In other embodiments, dielectric spacer layer 134 may have a thickness of between 50 angstroms and 10,000 angstroms, though other thicknesses may be used.

Figure 7B:
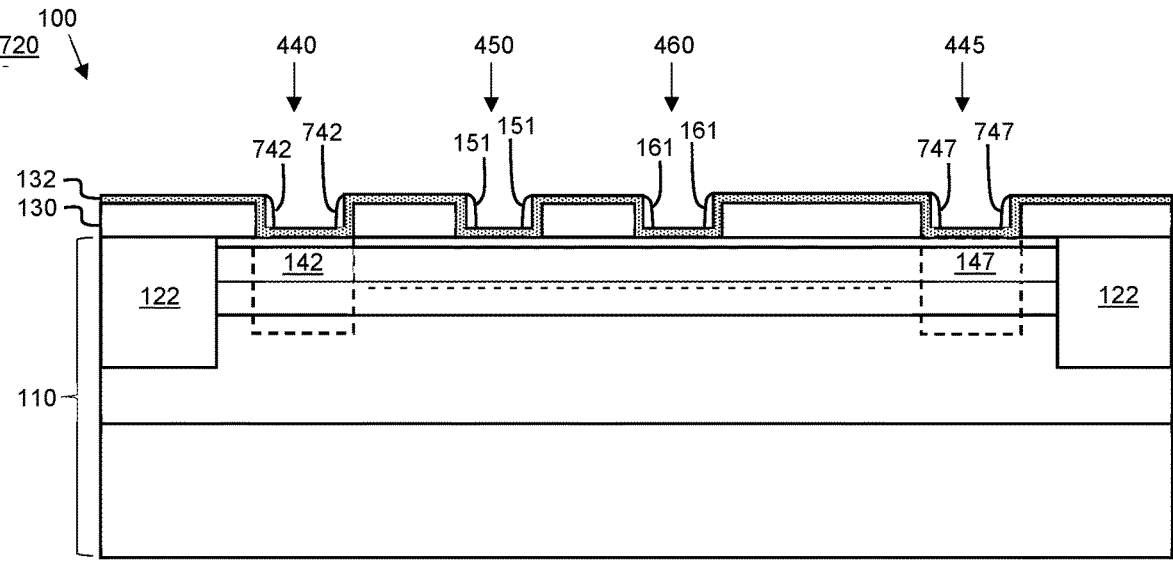

Referring now to FIG. 7B and fabrication stage 720, after depositing dielectric spacer layer 134, an etching process is then performed on the dielectric spacer layer 134 to form the gate spacers 151. In some embodiments, this also results in the formation of field plate spacers 161, source spacers 742, and drain spacers 747. According to one or more embodiments, the etching process includes an anisotropic etching process, which removes the material of dielectric spacer layer 134 in a substantially vertical direction. The etching process stops when the dielectric spacer layer 134 has been fully removed from all horizontal surfaces of the conformal dielectric layer 132, while remaining on the vertical surfaces of the conformal dielectric layer 132 within the source, drain, gate, and field plate openings 440, 445, 450, 460. This results in the formation of the gate and field plate spacers 151, 161, along with source and drain spacers 742, 747. For example, the etching process may include one or more dry etching processes, such RIE, ICP etching, ECR etching, or another suitable dry etching process. According to one or more embodiments, suitable dry etching techniques may use one or more of sulphur hexafluoride (SF$_6$), di-carbon hexafluoride (C$_2$F$_6$), carbon tetrafluoride (CF$_4$), tri-fluoromethane (CHF$_3$) or other chemistries. Again, it may be noted here that the inclusion of the gate spacers 151 enables device designs with shorter gate lengths (i.e., dimension 155, FIG. 1) than are achievable using conventional photolithography processes.

Figure 7C:
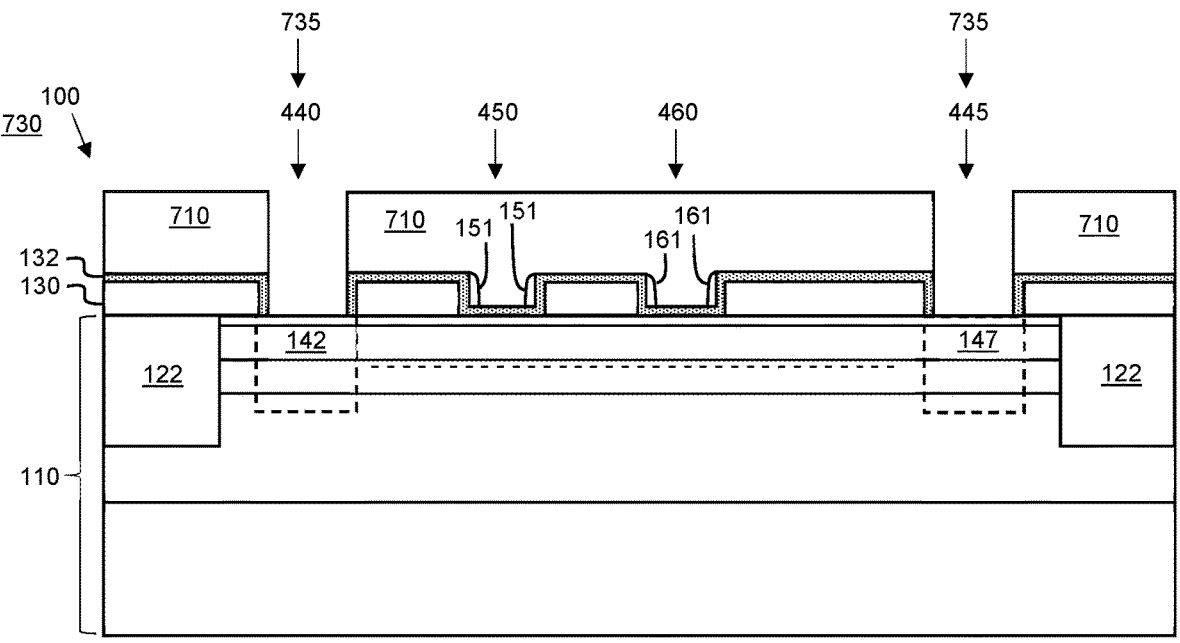

Referring now to FIG. 7C and fabrication stage 730, the source and drain spacers 742, 747 and the portions of the conformal dielectric layer 132 within the source and drain openings 440, 440 are removed. To remove these features, a photoresist layer 710 is deposited on or over the conformal dielectric layer 132, the source, drain, gate, and field plate spacers 742, 747, 151, 161, and exposed portions of the conformal dielectric layer 132 within the source and drain openings 440, 445. The photoresist layer 710 is then patterned to form photoresist openings 735 over the source and drain openings 440, 445, while remaining intact over the gate and field plate openings 450, 460 in order to protect the gate and field plate spacers 151, 161 from a subsequent etch process. As shown in FIG. 7C, the vertical sidewalls of the photoresist openings 735 may be co-planar with the vertical interior sidewalls of the portions of the conformal dielectric layer 132 that are located on the sidewalls of the source and drain openings 440, 445. This arrangement provides protection for those portions of the conformal dielectric layer 132 on those sidewalls during the subsequent etching process, while exposing the source and drain spacers 742, 747 and the portions of the conformal dielectric layer 132 within the source and drain openings 440, 440.

The source and drain spacers 742, 747 and the portions of the conformal dielectric layer 132 within the source and drain openings 440, 440 then may be removed using an etching process. Etching these features preferably includes performing an anisotropic etching process, although an isotropic etching process also may be used with an appropriate etchant. For example, the etching process may include one or more dry etching processes, such as RIE, ICP etching, ECR etching, or another suitable dry etching process. According to one or more embodiments, suitable dry etching techniques may use one or more of sulphur hexafluoride (SF$_6$), di-carbon hexafluoride (C$_2$F$_6$), carbon tetrafluoride (CF$_4$), tri-fluoromethane (CHF$_3$) or other chemistries. The photoresist mask 710 may be removed after removing the source and drain spacers 742, 747 and the portions of the conformal dielectric layer 132 within the source and drain openings 440, 440. Alternatively, the photoresist mask 710 may be used during a lift-off procedure, which is next implemented to form the source and drain contacts 140, 145.

Figure 7D:
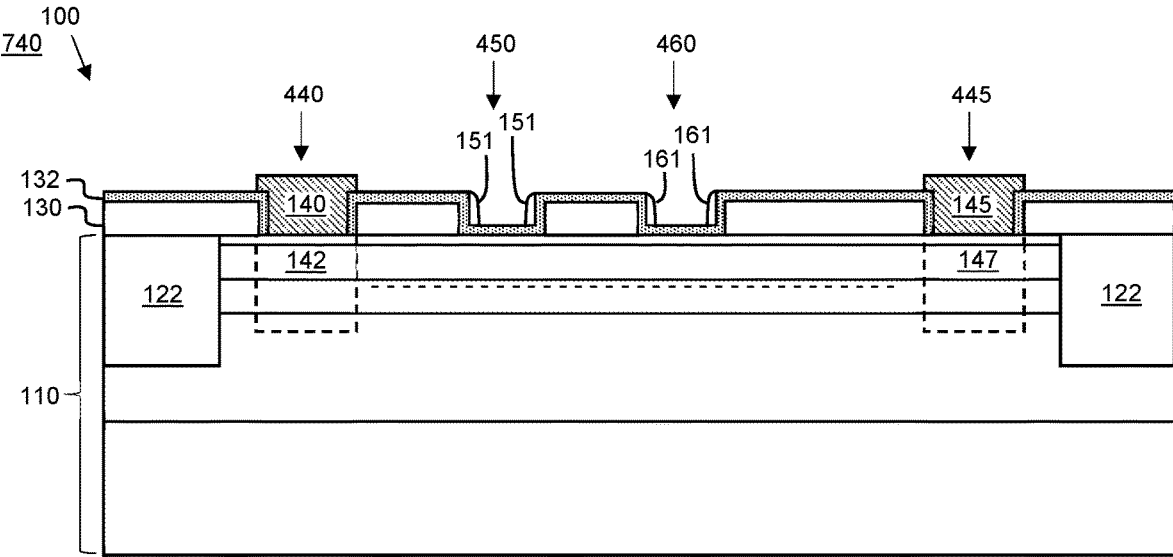

In block 214' of FIG. 2, and as depicted in fabrication stage 740 of FIG. 7D, the method may continue by forming and annealing the source and drain contacts 140, 145. Forming the source and drain contacts 140, 145 may be performed using a lift-off process, in which constituent layers of an ohmic stack are deposited into openings 735 in photoresist mask 710, and then photoresist mask 710 is removed, resulting in portions of the ohmic stack that are deposited on photoresist mask 710 being removed. Alternatively, if photoresist mask 710 was previously removed, forming the source and drain contacts 145 may include depositing constituent layers of the ohmic stack over the surface of the conformal dielectric layer 132 and into the source and drain openings 440, 445, and subsequently patterning the ohmic stack to remove all but portions of the ohmic stack that were deposited into the source and drain openings 440, 445. In various embodiments, the constituent layer(s) of the ohmic stack may be deposited by sputtering, evaporation, PVD, PECVD, or other suitable deposition techniques. In one or more embodiments, the ohmic stack may contain one or more conductive layers that include titanium (Ti), Al, titanium nitride (TiN), gold (Au), molybdenum (Mo), nickel (Ni), Si, Ge, platinum (Pt), tantalum (Ta), and/or other suitable materials. In other embodiments, the conductive layer(s) of the ohmic stack may include titanium-tungsten (TiW), titanium-aluminum (TiAl), or titanium-tungsten nitride (TiWN). In one or more specific embodiments, the ohmic stack may include a stack deposited into the source and drain openings 440, 445 that includes a Ti layer on the surface 103 of the substrate 110, an Al on or over the Ti layer, and a TiN layer on or over the Ti layer. For example, the Ti layer may be between about 10 angstroms and about 200 angstroms thick, the Al layer may be between about 100 angstroms and about 1500 angstroms thick, and the TiN layer may be between about 200 angstroms and about 2000 angstroms thick, although other thicknesses alternatively may be used. In other embodiments, other metals may be substituted for or placed additionally below or on top of the constituent layers of the ohmic stack (e.g., Mo, or Pt may be substituted for TiN, or Ta may be used in addition to Ti, above or below Ti, or substituted for Ti).

After depositing the constituent layers of the ohmic stack, an annealing process may be performed to alloy the ohmic stack, resulting in ohmic contacts to the source and drain regions 142 and 147 of the semiconductor substrate 110 (i.e., to the 2-DEG of the channel 107). It should be noted here that the conformal dielectric layer 132, having been deposited over the upper surface 103 of the substrate 110 at the bottom extents of the gate and field plate openings 450, 460, acts to protect the surface of the substrate 110 within openings 450, 460 during the annealing process. Otherwise, without these protective portions of the conformal dielectric layer 132 within the gate and field plate openings 450, 460, the high temperature of the annealing process may result in contamination of the channel 107. Once again, the conformal dielectric layer 132 has the beneficial effect of enabling the source and drain contacts 140, 145 to be subject to annealing at high temperatures without contaminating the channel 107 at this stage of fabrication.

In an embodiment, the annealing step may be accomplished by rapid thermal annealing. For example, the ohmic stack may be alloyed at a temperature of between about 400 degrees Celsius and about 700 degrees Celsius for between about 15 seconds and about 60 seconds. In other embodiments the ohmic stack may be annealed at between about 300 degrees Celsius and about 900 degrees Celsius for between about 10 seconds and about 600 seconds, though other higher or lower temperatures and/or times may be used.

To complete the formation of the source and drain contacts 140, 145, the annealed ohmic stack is then patterned to form the source and drain electrodes 140 and 145. More specifically, a photoresist layer (not illustrated) may be deposited over the ohmic stack, and the photoresist layer is patterned to form photoresist openings over portions of the ohmic stack outside of the desired locations of the source and drain electrodes 140, 145. Said another way, the photoresist layer is patterned to protect portions of the ohmic stack within the source and drain openings 440, 445. Portions of the ohmic stack that are exposed through the openings in the photoresist layer are then removed by etching through the ohmic stack, while stopping at the upper surface of the lower dielectric layer 130. Etching the ohmic stack preferably includes performing a well-controlled dry etching process, such as RIE, ICP etching, ECR etching, or other suitable dry etching processes. In an alternate embodiment, a suitable wet chemical etching process may be performed. The etching process results in the formation of the source and drain electrodes 140, 145.

Figure 8:
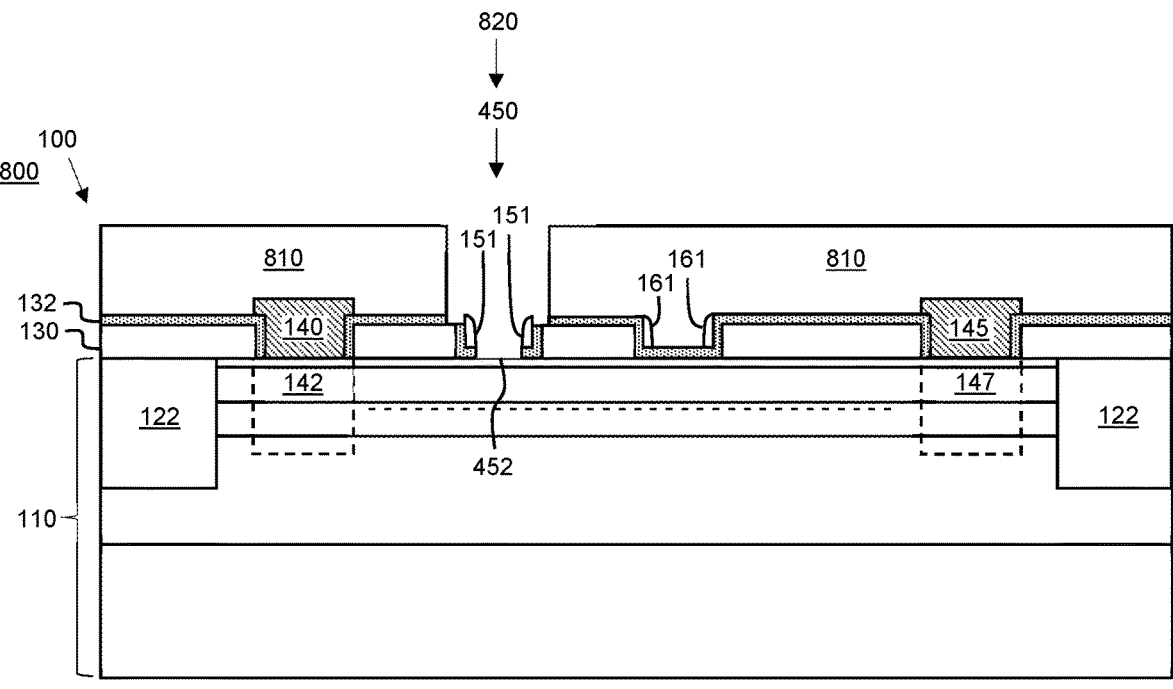
FIGS. 8, 9, 10, 11, 12, and 13 are cross-sectional, side views of partially formed versions of the transistor of FIG. 1 illustrating various subsequent stages of fabrication, in accordance with one or more embodiments.

Regardless of whether the first sequence of processes (FIGS. 6A-6D) or the second sequence of processes (FIGS. 7A-7D) is used to form the drain and source contacts 140, 145 and the gate spacers 151, the method continues in block 216 of FIG. 2, and as depicted in fabrication stage 800 of FIG. 8, by removing portions of the conformal dielectric layer 132 between the gate spacers 151 at the bottom extent 452 of the gate opening 450, in order to re-expose the upper surface of the semiconductor substrate 110 within that opening 450 prior to formation of the gate 150. To remove the portions of conformal dielectric layer 132 at the bottom extent 452 of the gate opening 450, a photoresist layer 810 is deposited on or over the conformal dielectric layer 132, and the photoresist layer 810 is patterned to form photoresist opening 820 over the gate opening 450. According to one or more embodiments, the opening 820 in the photoresist layer 810 extends a short distance over the passivation layer 130 on either side of the gate opening 450.

The portion of the conformal dielectric layer 132 at the bottom extent 452 of the gate opening 450 then may be removed by etching through the portion of layer 132 that is exposed by the photoresist openings 820, while stopping at or slightly below the upper surface 103 of the base substrate 110. Etching the exposed portions of the conformal dielectric layer 132 may include using one or more wet and/or dry etching processes and chemistries that have low selectivity to the material of the conformal dielectric layer 132 (i.e., a process and/or chemistry that are designed to etch layer 132), but which are highly selective to the material of the gate spacers 151 (i.e., a process and/or chemistry that will not significantly etch the gate spacers 151). It may be noted here that portions of the conformal dielectric layer 132 exposed through opening 820 at the upper portions of the gate spacers 151 (i.e., portions of layer 132 overlying the upper surface of passivation layer 130) also are etched away during the etching process.

For example, in some embodiments, the etching process may include a wet etch using HF or BOE. In other embodiments, the etching process may include a chlorine plasma etch. Other suitable etching processes and chemistries alternatively may be used. Essentially, the etching process results in complete removal of the portion of the conformal dielectric layer 132 at the bottom extent 452 of the gate opening 450, as shown in FIG. 8. In addition, the etching process results in removal of the portion of the conformal dielectric layer 132 at the upper portion of the gate spacers 151, thus exposing the upper surface of the passivation layer 130 on either side of the gate opening 450. According to an embodiment, photoresist layer 810 is not removed after the etching process, but instead is retained and used in forming the gate electrode 150.

Figure 9:
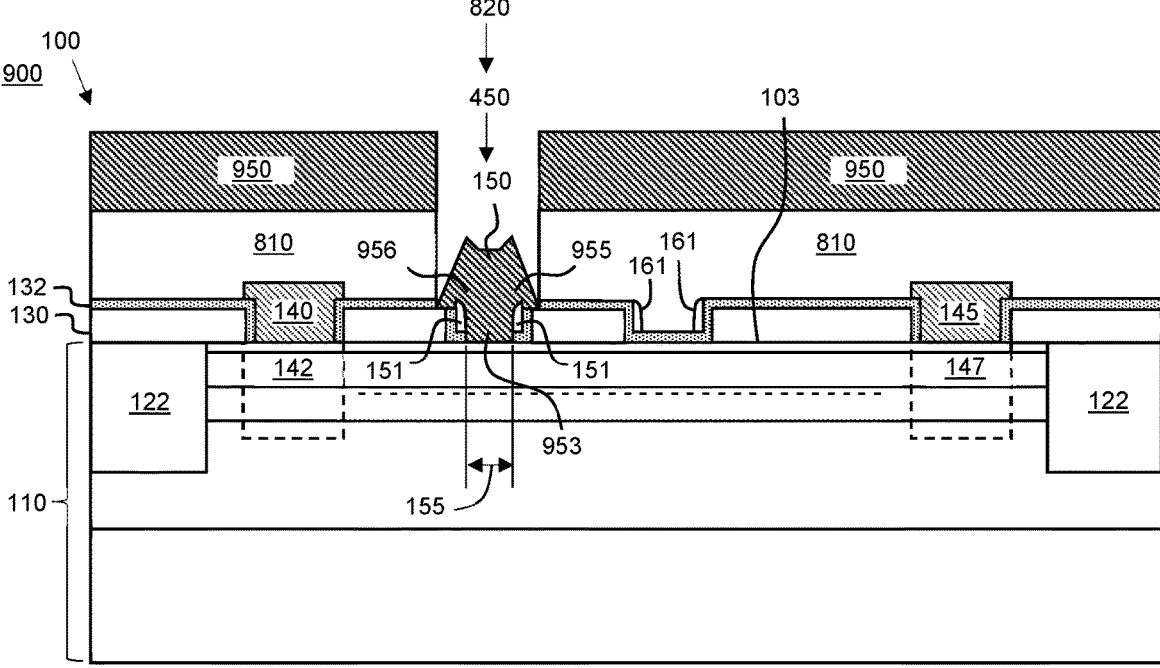

In block 218 of FIG. 2, and as depicted in fabrication stage 900 of FIG. 9, the method may continue by forming the gate electrode 150. According to one or more embodiments, the gate electrode 150 may be formed using a lift-off process. More specifically, as depicted in FIG. 9, a conductive gate metal layer 950 is deposited on the patterned photoresist layer 810. In addition, the gate metal layer 950 is deposited through the photoresist opening 820 onto exposed portions of the passivation layer 130, the gate spacers 151, and the upper surface 103 of the substrate 110 (between the gate spacers 151). The portion of the gate metal layer 950 deposited within the photoresist opening 820 forms the gate electrode 150. In one or more embodiments, the various layers of the gate metal layer 950 may be deposited using evaporation, sputtering. PVD, or other suitable deposition technique(s).

According to various embodiments, the gate metal layer 950 may include a metal stack of one or more Schottky contact material layers combined with one or more low stress conductive material layers. For example, a first layer within the multi-stack used to form the gate electrode 150 may include Ti, Ni, Pt, Cu, palladium (Pd), Cr. W, iridium (Ir), poly-silicon or other suitable materials. The first layer may be between about 30 and about 2,000 angstroms in thickness, although other thickness values may be used. One or more layers that act as conductive layers may be deposited on or over the first layer to form the gate electrode 150, according to an embodiment. The conductive layer(s) may include Au, Ag. Al, Cu, Ti or other substantially conductive materials. The conductive layer(s) may be between about 50 and about 20,000 angstroms in thickness, although other thickness values may be used. Optionally, one or more barrier metal layers may be placed between the first layer and the conductive layer(s), where the barrier metal layer(s) may include materials such as Ni, Pt, Cu, Pd, Cr. W, Ir or other substantially refractive materials that act as a barrier between the portion of the first layer that contacts the semiconductor substrate 110 and the conductive layer(s). The barrier metal layer(s) may be between about 50 and about 10,000 angstroms in thickness, although other thickness values may be used.

It should be appreciated that other methods may be used to form the gate electrode 150 without departing from the scope of the inventive subject matter. For example, in other embodiments, the gate metal layer 1050 may be disposed into the gate opening 450 over a gate dielectric (not shown), such as $SiO_2$, $HfO_2$, $Al_2O_3$, or similar materials.

Once the gate metal layer 950 is deposited, a lift-off process is then performed to remove the photoresist layer 810 and the portions of the gate metal layer 950 deposited on the photoresist layer 810, while leaving the portion of the gate metal layer 950 deposited into the photoresist opening 820 intact. According to an alternate embodiment, rather than performing a lift-off process, photoresist layer 810 may be removed, the gate metal layer 950 may be deposited over the surface of the device and into the gate opening 450, and the gate metal layer 950 may be patterned to remove all material except that forming the gate electrode 150.

Either process results in a gate electrode 150 that has a stem 953 that extends into the gate opening 450, contacting the gate spacers 151, sidewalls of the conformal dielectric layer 132 at the bottom of the gate opening 450, and the upper surface 103 of the semiconductor substrate 110. The gate electrode 150 also has first and second overhanging or protruding segments 955, 956 that overlie and/or contact the upper surface of dielectric layers 130 and 132 on both sides of the gate opening 450. The first segment 955 extends from the stem 953 toward the drain electrode 145, and the second segment 956 extends from the stem 953 toward the source electrode 140.

The portion of the stem 953 that contacts the upper surface 103 of the substrate 110 defines the gate channel. As mentioned previously, the gate channel may be characterized by a gate length 155 where the stem 953 of the gate electrode 150 contacts the semiconductor substrate 110 (i.e., where the gate electrode 150 electrically couples to the channel 107). In various embodiments, the gate length 155 may be less than 0.25 microns, less than 0.5 microns, between about 0.1 microns and about 1 micron, or up to about 5 microns.

Figure 10:
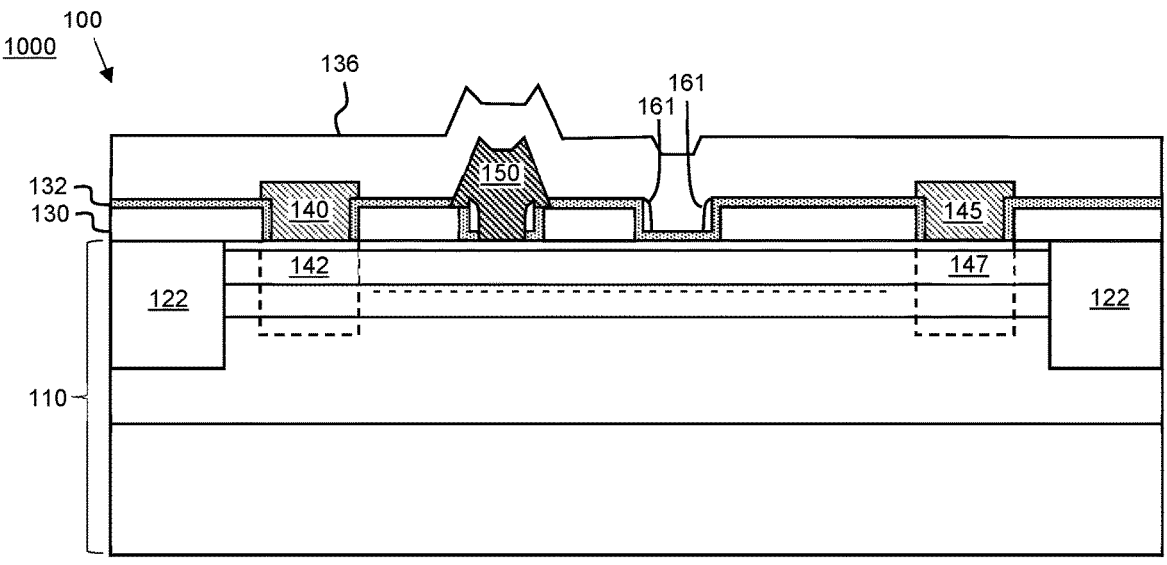

In block 220 of FIG. 2, and as depicted in fabrication stage 1000 of FIG. 10, the method may continue by forming the upper dielectric layer 136 over the source and drain contacts 140, 145, the gate electrode 150, and the ultimate location of the to-be-formed field plate 160. In one or more embodiments, the upper dielectric layer 136 may include one or more layers of SiN, $Al_2O_3$, $SiO_2$, $HfO_2$, indium tin oxide (ITO), diamond, poly-diamond, AlN, boron nitride (BN), SiC, or a combination of these or other insulating materials. The total thickness of the layer(s) used to form the upper dielectric layer 136 may be between about 100 and about 10,000 angstroms in thickness, although other thickness values may be used. The upper dielectric layer 136 may be deposited using LPCVD, ALD, sputtering, PVD, CVD (including PECVD, MOCVD, catalytic CVD, HWCVD, ICP CVD, and ECR CVD), a combination of these or other suitable dielectric deposition technique(s).

Figure 11:
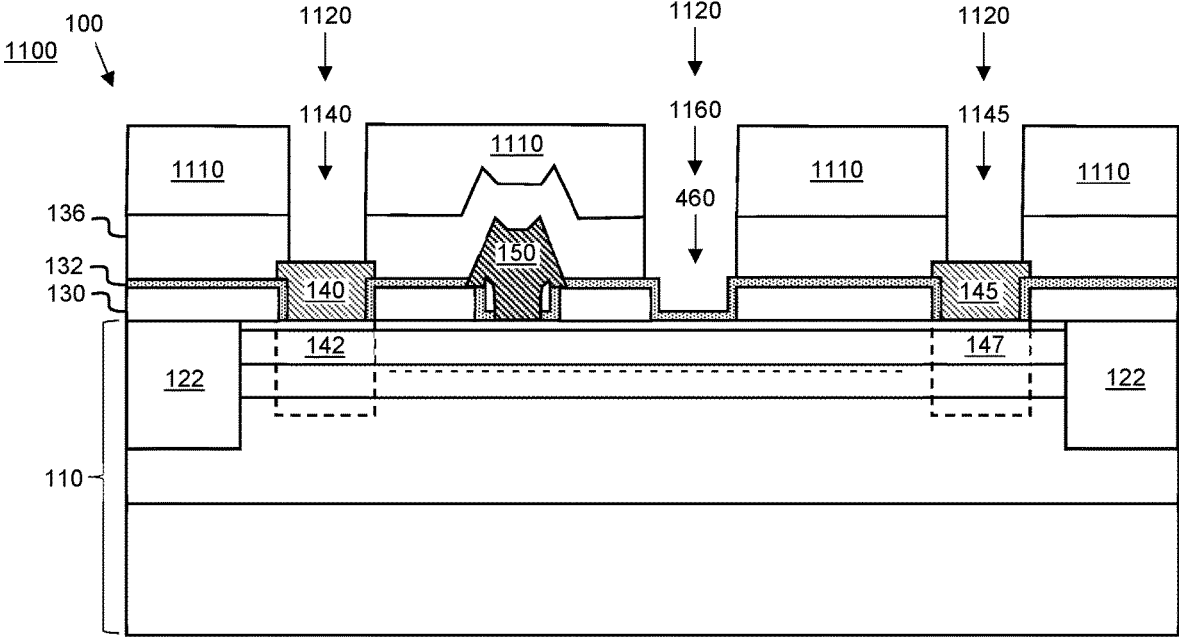

In block 222 of FIG. 2, and as depicted in fabrication stage 1100 of FIG. 11, the method may continue by forming source, drain, and field plate contact openings 1140, 1145, 1160 through the upper dielectric layer 136. To achieve this, a photoresist layer 1110 may be formed over the upper dielectric layer 136. Once dispensed, the photoresist layer 1110 is patterned to form resist openings 1120 over the source electrode 140, the drain electrode 145, and the field plate opening 460, respectively.

These openings 1120 expose the upper surface of the upper dielectric layer 136. Source, drain, gate, and field plate contact openings 1140, 1145, 1160 through the upper dielectric layer 136 then may be created by etching through the upper dielectric layer 136 in areas exposed by the photoresist openings 1120, while stopping at the upper surface source and drain contacts 140, 145 and the conformal dielectric layer 132. In addition, the etching process (or an additional etching process) may be performed to remove the field plate spacers 161.

Etching the lower dielectric layer 130 and the field plate spacers 161 preferably includes performing one or more anisotropic etching process that are highly selective to the material of the conformal dielectric layer 132. For example, the etching process may include one or more dry etching processes, such as RIE, ICP etching. ECR etching, or another suitable dry etching process. According to one or more embodiments, suitable dry etching techniques may use one or more of sulphur hexafluoride ($SF_6$), di-carbon hexafluoride ($C_2F_6$), carbon tetrafluoride ($CF_4$), tri-fluo-romethane ($CHF_3$) or other chemistries. In alternate embodiments, a suitable wet chemical etching process alternatively may be performed. The photoresist mask 1110 may be removed after forming the source, drain, and field plate contact openings 1140, 1145, 1160.

At this point, source and drain metallization 185, 186, the field plate 160, and the field plate-to-source connection 180 are formed. Various different process sequences may be used to complete these processes. Blocks 224 and 226 (corresponding to fabrication stages 1200, 1300, FIGS. 12, 13) are used to describe a first process sequence. Block 224' later is used to describe a second process sequence.

Starting first with blocks 224 and 226, and according to one or more first embodiments, the first process sequence includes first blanket depositing an interconnect metal layer (block 224), and subsequently patterning that layer to define the source and drain metallization 185, 186 and the field plate-to-source connection 180 (block 226).

Figure 12:
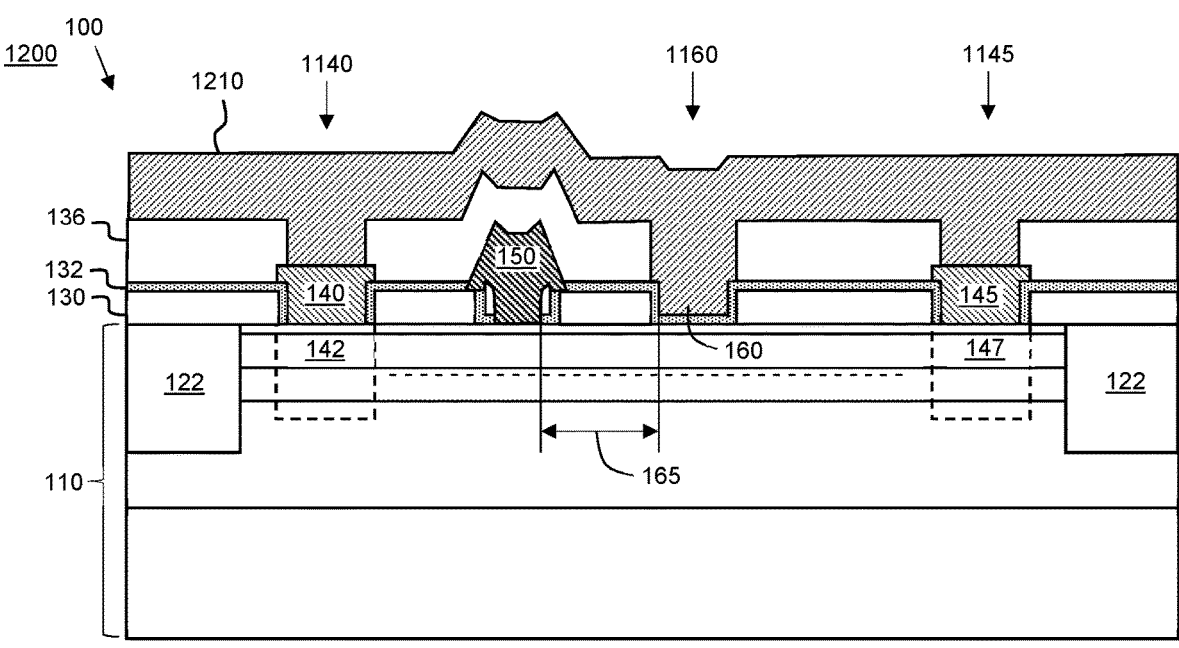

In block 224 of FIG. 2, and as depicted in fabrication stage 1200 of FIG. 12, the method involves blanket depositing an interconnect metal layer 1210 on or over the upper dielectric layer 136 and into the source, drain, gate, and field plate contact openings 1140, 1145, 1160. It may be noted here that the portion of the interconnect metal layer 1210 that is deposited at the lower extent of the field plate opening 1160 corresponds to the field plate 160 of the device. As mentioned previously, the relative arrangement of the gate electrode 150 and the field plate 160 may be characterized by a gate-to-field plate spacing (e.g., dimension 165). In some embodiments, the gate-to-field plate spacing 165 may be between about 0.2 microns and about 0.5 microns, although the field plate-to-gate distance may be shorter or longer, as well.

In one or more embodiments, the interconnect metal layer 1210 may be deposited by sputtering, evaporation, PVD, or other suitable deposition techniques. In one or more embodiments, the interconnect metal layer 1310 may contain one or more materials selected from Ti, Al, TiN, TiW, TiAl, and/or TiWN, Au, Mo, Ni, Si, Ge, Pt. Ta, Cu, Au, Ag, and/or other suitable materials.

Figure 13:
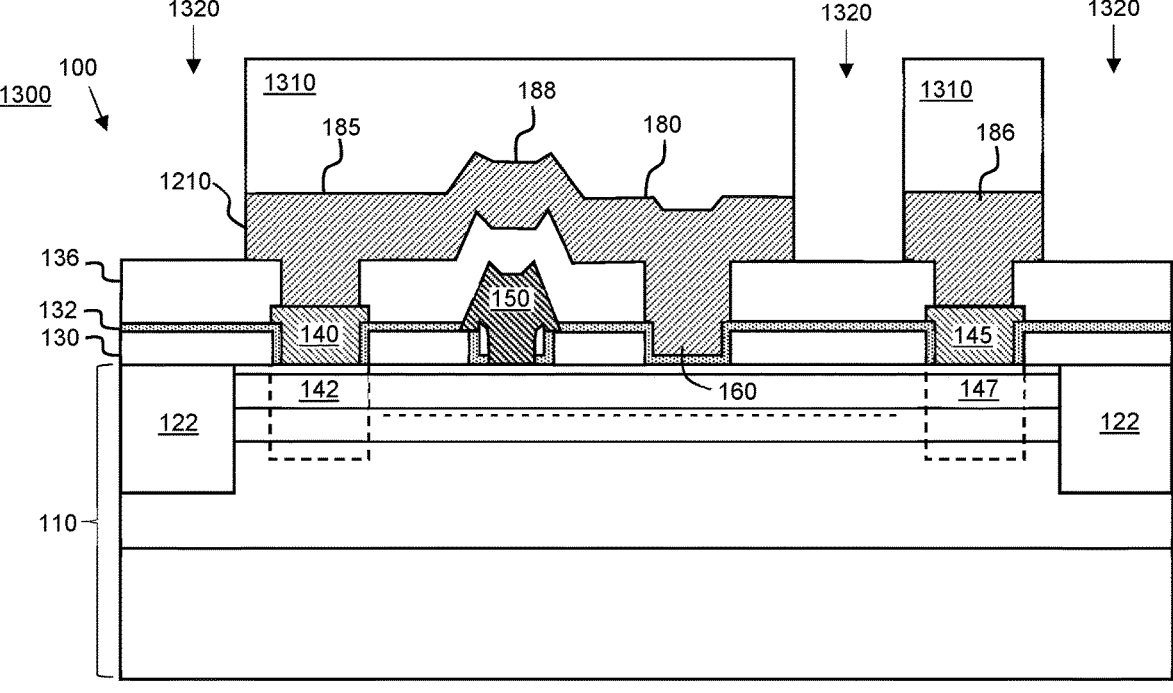

In block 226 of FIG. 2, and as depicted in fabrication stage 1300 of FIG. 13, the method may continue by patterning the interconnect metal layer 1210 to form source metallization 185, drain metallization 186, and a conductive connection 180 between the field plate 160 and the source metallization 185 (i.e., between the field plate 160 and the source region 142).

This process may include forming and patterning a photoresist layer 1310 over interconnect metal layer 1210. More specifically, once dispensed, the photoresist layer 1310 is patterned to form resist openings 1320 over portions of the interconnect metal layer 1210 outside of the desired locations of the source and drain metallization 185, 186 and the conductive connection 180. Said another way, the photoresist layer 1310 is patterned to protect portions of the interconnect metal layer 1210 over the source and drain electrodes 140, 145, over the field plate 160, and between the field plate 160 and the source electrode 140.

Portions of layers the interconnect metal layer 1210 that are exposed through openings 1320 in the photoresist layer 1310 are then removed by etching through those portions of the interconnect metal layer 1210, while stopping at the upper surface of the upper dielectric layer 136. Etching the interconnect metal layer 1210 preferably includes performing a dry etching process, such as RIE, ICP etching, ECR etching, or other suitable dry etching processes. For example, suitable dry etching techniques may use one or more of $SF_6$, $C_2F_6$, $CF_4$, $CHF_3$ or other chemistries like BCl3/Cl2, according to an embodiment. In an alternate embodiment, a suitable wet chemical etching process may be performed.

The etching process results in the formation of the source and drain metallization 185, 186 and the conductive connection 180 between the field plate 160 and the source metallization 185. As mentioned previously, in some embodiments, the field plate source connection 180 includes conductive straps 188, which include relatively-narrow conductors spaced along the transistor finger that extend, periodically, over the gate electrode 150 to electrically couple multiple connection points along the field plate 160 to the source electrode 140. In other embodiments, rather than including conductive straps 188, the field plate source connection 180 may include a solid, continuous conductive structure between the field plate 160 and the source electrode 140. The patterned photoresist layer 1310 is removed, resulting in semiconductor device 100 depicted in FIG. 1.

Moving now to block 224', and according to one or more alternate embodiments, the process of forming the source and drain metallization, the field plate, and the field plate-to-source connection alternatively may use a lift-off process. Similar to the process described in conjunction with forming the gate electrode 150, the lift-off process for forming the source and drain metallization 185, 186, the field plate 160, and the field plate-to-source connection 180 may include depositing a photoresist layer, and patterning the photoresist layer to include openings where the source and drain metallization 185, 186 and the field plate 160 are to be formed. The process may continue by depositing the interconnect metal layer (e.g., layer 1210) onto the upper surface of the photoresist layer and into the openings in the photoresist layer. A lift-off process may then be performed to remove the photoresist layer and the portions of the interconnect metal layer deposited on the photoresist layer, while leaving portions of the interconnect metal layer deposited into the photoresist opening intact.

Regardless of which sequence of processes are used to form the drain and source metallization 185, 186, the field plate 160, and the field plate-to-source connection 180, the method continues in block 228 of FIG. 2 by completing fabrication of device 100. This may include forming additional dielectric layers and conductive layers (e.g., M1, M2, etc.) over the partially-formed device to provide selective electrical connections between various features of the device 100 (e.g., input/output bondpads, other transistor fingers, and so on). The method of FIG. 2 may then end.

An embodiment of a semiconductor device includes a semiconductor substrate with an upper surface and a channel, and one or more lower dielectric layers disposed on the upper surface of the semiconductor substrate. Source, drain, gate, and field plate openings extend through the lower dielectric layer(s) to the semiconductor substrate. A conformal dielectric layer is disposed over the lower dielectric layer(s) and into at least the gate opening and the field plate opening. The conformal dielectric layer includes first portions formed on sidewalls of the gate opening, second portions formed on sidewalls of the field plate opening, and a third portion formed on the semiconductor substrate at a bottom extent of the field plate opening. Gate spacers are disposed on the first portions of the conformal dielectric layer. A gate electrode is disposed in the gate opening in contact with the gate spacers and the semiconductor substrate. A field plate is disposed in the field plate opening in contact with the second and third portions of the conformal dielectric layer.

An embodiment of a method for forming a semiconductor device includes forming one or more lower dielectric layers over an upper surface of a semiconductor substrate that includes a channel. The method further includes, using one patterned photoresist mask, simultaneously forming a plurality of openings through the one or more lower dielectric layers, where the plurality of openings includes a gate opening and a field plate opening. A conformal dielectric layer is deposited into the plurality of openings. The conformal dielectric layer includes first portions formed on sidewalls of the gate opening, second portions formed on sidewalls of the field plate opening, and a third portion formed on the semiconductor substrate at a bottom extent of the field plate opening. Gate spacers are formed in the gate opening on the first portions of the conformal dielectric layer. A gate electrode is formed in the gate opening in contact with the dielectric gate spacers. A field plate is formed in the field plate opening in contact with the second and third portions of the conformal dielectric layer.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

For the sake of brevity, conventional semiconductor fabrication techniques may not be described in detail herein. In addition, certain terminology may also be used herein for reference only, and thus are not intended to be limiting, and the terms "first," "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

What is claimed is:

1. A semiconductor device comprising:
a semiconductor substrate comprising an upper surface and a channel;
one or more lower dielectric layers disposed on the upper surface of the semiconductor substrate, wherein a source opening, a drain opening, a gate opening, and a field plate opening extend through the one or more lower dielectric layers to the semiconductor substrate, wherein the gate opening is between the source opening and the drain opening, and the field plate opening is between the gate opening and the drain opening;
a conformal dielectric layer disposed over the one or more lower dielectric layers and into at least the gate opening and the field plate opening, wherein the conformal dielectric layer includes first portions formed on sidewalls of the gate opening, second portions formed on sidewalls of the field plate opening, and a third portion formed on the semiconductor substrate at a bottom extent of the field plate opening;
gate spacers disposed on the first portions of the conformal dielectric layer within the gate opening;
a gate electrode disposed in the gate opening in direct contact with the gate spacers and the semiconductor substrate; and
a field plate disposed in the field plate opening in contact with the second and third portions of the conformal dielectric layer.

2. The semiconductor device of claim 1, wherein:
the conformal dielectric layer further includes a fourth portion formed on the semiconductor substrate at a bottom extent of the gate opening, wherein the gate electrode extends through an opening in the fourth portion to contact the semiconductor substrate, and wherein the gate spacers are formed on both the first and fourth portions of the conformal dielectric layer.

3. The semiconductor device of claim 1, wherein:
the conformal dielectric layer is formed from a dielectric material selected from aluminum oxide and aluminum nitride.

4. The semiconductor device of claim 1, wherein:
the conformal dielectric layer has a thickness in a range of 50 angstroms to 200 angstroms.

5. The semiconductor device of claim 1, wherein:
the gate spacers are formed from silicon nitride.

6. The semiconductor device of claim 5, wherein:
the gate electrode has a T-shaped cross-section with a stem that extends through the one or more lower dielectric layers to contact the semiconductor substrate, and first and second protruding regions that extend over the gate spacers and the one or more lower dielectric layers.

7. The semiconductor device of claim 1, wherein:
the field plate is recessed below an upper surface of the one or more lower dielectric layers.

8. The semiconductor device of claim 1, wherein:
the conformal dielectric layer further includes fifth portions formed on sidewalls of the source opening, and sixth portions formed on sidewalls of the drain opening.

9. The semiconductor device of claim 8, wherein:
the conformal dielectric layer further includes a seventh portion formed over an upper surface of the one or more lower dielectric layers, wherein the seventh portion extends from one of the fifth portions formed on the sidewalls of the source opening toward one of the first portions formed on the sidewalls of the gate opening; and the conformal dielectric layer further includes an eighth portion formed over the upper surface of the one or more lower dielectric layers, wherein the eighth portion extends from one of the sixth portions formed on the sidewalls of the drain opening toward one of the second portions formed on the sidewalls of the field plate opening.

10. A semiconductor device comprising:

a semiconductor substrate comprising an upper surface and a channel;

one or more lower dielectric layers disposed on the upper surface of the semiconductor substrate, wherein a source opening, a drain opening, a gate opening, and a field plate opening extend through the one or more lower dielectric layers to the semiconductor substrate, wherein the gate opening is between the source opening and the drain opening, and the field plate opening is between the gate opening and the drain opening;

a source electrode deposited in the source opening;

a conformal dielectric layer disposed over the one or more lower dielectric layers and into at least the gate opening and the field plate opening, wherein the conformal dielectric layer includes first portions formed on sidewalls of the gate opening, second portions formed on sidewalls of the field plate opening, and a third portion formed on the semiconductor substrate at a bottom extent of the field plate opening;

gate spacers disposed on the first portions of the conformal dielectric layer;

a gate electrode disposed in the gate opening in contact with the gate spacers and the semiconductor substrate;

a field plate disposed in the field plate opening in contact with the second and third portions of the conformal dielectric layer;

one or more upper dielectric layers disposed over the one or more lower dielectric layers and over the gate electrode; and a conductive connection that extends over the one or more upper dielectric layers and over the gate electrode to electrically connect the field plate to the source electrode.

11. The semiconductor device of claim 10, wherein:

the field plate and the conductive connection are formed from a same metal layer.

12. A method for forming a semiconductor device, the method comprising:

forming one or more lower dielectric layers over an upper surface of a semiconductor substrate that includes a channel;

using one patterned photoresist mask, simultaneously forming a plurality of openings through the one or more lower dielectric layers, wherein the plurality of openings includes a gate opening and a field plate opening;

forming a source opening through the one or more lower dielectric layers;

forming a source electrode in the source opening;

depositing a conformal dielectric layer into the plurality of openings, wherein the conformal dielectric layer includes first portions formed on sidewalls of the gate opening, second portions formed on sidewalls of the field plate opening, and a third portion formed on the semiconductor substrate at a bottom extent of the field plate opening;

forming gate spacers in the gate opening on the first portions of the conformal dielectric layer;

forming a gate electrode in the gate opening in contact with the dielectric gate spacers;

forming a field plate in the field plate opening in contact with the second and third portions of the conformal dielectric layer;

disposing one or more upper dielectric layers over the one or more lower dielectric layers and over the gate electrode; and forming a conductive connection that extends over the one or more upper dielectric layers and over the gate electrode to electrically connect the field plate to the source electrode.

13. The method of claim 12, wherein:

the conformal dielectric layer also includes a fourth portion formed on the semiconductor substrate at a bottom extent of the gate opening, wherein the gate electrode extends through an opening in the fourth portion to contact the semiconductor substrate; and forming the gate spacers includes forming the dielectric gate spacers on the first and fourth portions of the conformal dielectric layer.

14. The method of claim 12, wherein:

depositing the conformal dielectric layer comprises performing atomic layer deposition to deposit the conformal dielectric layer on horizontal and vertical surfaces of the one or more lower dielectric layers.

15. The method of claim 12, wherein:

the conformal dielectric layer has a thickness in a range of 50 angstroms to 200 angstroms; and the conformal dielectric layer is formed from a dielectric material selected from aluminum oxide and aluminum nitride.

16. The method of claim 12, wherein:

the gate spacers are formed from silicon nitride.

17. The method of claim 12, wherein:

forming the plurality of openings also includes, using the one patterned photoresist mask, forming the source opening and a drain opening through the one or more lower dielectric layers simultaneously with forming the gate opening and the field plate opening, wherein the gate opening is between the source opening and the drain opening, and the field plate opening is between the gate opening and the drain opening.

18. The method of claim 17, further comprising:

removing portions of the conformal dielectric layer at bottom extents of the source opening and the drain opening; and after removing portions of the conformal dielectric layer at the bottom extents of the source opening and the drain opening, forming the source electrode in the source opening, and forming a drain electrode in the drain opening.

19. The method of claim 17, further comprising:

forming a source electrode in the source opening;

forming one or more upper dielectric layers over the one or more lower dielectric layers; and forming a conductive connection that extends over the one or more upper dielectric layers and over the gate electrode to electrically connect the field plate to the source electrode.

20. The method of claim 19, wherein:

forming the field plate and forming the conductive connection are performed simultaneously by depositing a conductive layer.

* * * * *